(12) United States Patent
Kishikawa

(10) Patent No.: US 7,733,461 B2
(45) Date of Patent: Jun. 8, 2010

(54) EXPOSURE APPARATUS

(75) Inventor: Yasuhiro Kishikawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 404 days.

(21) Appl. No.: 11/473,039

(22) Filed: Jun. 23, 2006

(65) Prior Publication Data

US 2006/0290912 A1    Dec. 28, 2006

(30) Foreign Application Priority Data

Jun. 23, 2005 (JP) ............................. 2005-183010
May 11, 2006 (JP) ............................. 2006-132301

(51) Int. Cl.
    *G03B 27/52* (2006.01)
(52) U.S. Cl. .......................................... 355/30; 355/53
(58) Field of Classification Search ................... 355/30, 355/53
    See application file for complete search history.

(56) References Cited

U.S. PATENT DOCUMENTS

| 5,489,966 | A  | * | 2/1996  | Kawashima et al. .......... 355/43 |
| 6,024,428 | A  | * | 2/2000  | Uchikata ....................... 347/7 |
| 6,661,522 | B2 | * | 12/2003 | Ouchi .......................... 356/515 |
| 2005/0046813 | A1 | * | 3/2005 | Streefkerk et al. ............. 355/30 |
| 2005/0179877 | A1 | * | 8/2005 | Mulkens et al. ............... 355/30 |

FOREIGN PATENT DOCUMENTS

| JP | 10-340864   | 12/1998 |
| JP | 2004-301825 | 10/2004 |

* cited by examiner

*Primary Examiner*—Edward J Glick
*Assistant Examiner*—Mesfin T Asfaw
(74) *Attorney, Agent, or Firm*—Fitzpatrick, Cella, Harper & Scinto

(57) ABSTRACT

An exposure apparatus includes an illumination optical system for illuminating a reticle with exposure light, a projection optical system for projecting a pattern of the reticle onto a plate via a liquid supplied to a space between the projection optical system and the plate, a supply pipe for supplying the liquid to the space, a recovery pipe for recovering the liquid from the space, and a measuring unit for measuring a refractive index of the liquid. The measuring unit includes (i) a light source for generating a measurement light having the same wavelength as that of the exposure light, (ii) a liquid reservoir for storing the liquid, the liquid reservoir being disposed apart from the space via the supply pipe or the recovery pipe, and having a transmitting surface for transmitting the measurement light and a reflecting surface for reflecting the measurement light transmitted by the transmitting surface and the liquid in the reservoir, and (iii) a detector for detecting the measurement light reflected on the reflecting surface and transmitted by the liquid in the liquid reservoir and the transmitting surface.

10 Claims, 20 Drawing Sheets

EXPOSURE APPARATUS

This application claims foreign priority benefit based on Japanese Patent Applications No. 2005-183010, filed on Jun. 23, 2005, and No. 2006-132301, filed on May 11, 2006, each of which is hereby incorporated by reference herein in its entirety as if fully set forth herein.

BACKGROUND OF THE INVENTION

The present invention relates, generally, to an exposure apparatus, and, more particularly, to an exposure apparatus that exposes a plate, such as a wafer for a semiconductor device, and a glass plate for a liquid crystal display ("LCD"). The present invention is suitable, for example, for a so-called immersion exposure apparatus that immerses, in a liquid, a space between a plate and a final surface (of a final optical element) of a projection optical system, and exposes the plate via the liquid.

A conventional projection exposure apparatus uses a projection optical system to expose a circuit pattern of a reticle (or a mask) onto a wafer, etc., and a demand for a high-resolution exposure apparatus has recently increasingly grown. Immersion lithography is one attractive measure to meet this high-resolution demand. Immersion lithography promotes an increase of a numerical aperture ("NA") of the projection optical system by replacing a medium at the wafer side of the projection optical system with a liquid. The projection exposure apparatus has an NA of $n \cdot \sin \theta$, where n is a refractive index of the medium. The NA increases up to n when the medium has a refractive index greater than that of air, i.e., n>1. Immersion lithography intends to reduce the resolution R (which is defined as $R=k_1(\lambda/NA)$) of the exposure apparatus, where $k_1$ is a process constant, and $\lambda$ is a wavelength of a light source.

When the exposure light is irradiated onto the liquid and the temperature, the chemical structure, and thus, the refractive index of the liquid change with time, the imaging performance of the projection optical system (exposure apparatus) deteriorates due to a focus error, and various aberrations, such as a spherical aberration and a curvature of field. The exposure apparatus should precisely transfer a reticle pattern onto the plate, and the transferred pattern is sensitive to the aberrations with a progress of the finer processing to the semiconductor device. In particular, applications of an aqueous solution and an organic solvent to the liquid are now under investigation to advance the high NA scheme of the projection optical system. It is foreseeable that the imaging performance of the exposure apparatus depends upon the change in the refractive index in the aqueous solution and organic solvent caused by temperature and chemical structure changes.

One proposed immersion exposure apparatus includes measuring means for measuring the refractive index of the liquid. See, for example, Japanese Patent Applications, Publication Nos. ("JPs") 10-340864 and 2004-301825.

The device in JP 10-340864 measures an aberration of the projection optical system, calculates an amount of the change in the refractive index from the measurement result, and adjusts a refractive index by controlling an additive amount of an additive or a liquid component ratio. Since it takes an amount of time to measure an aberration, the device in JP 10-340846 cannot promptly adjust the change in the refractive index once the change occurs. Thus, it is not always preferable to use the aberration measuring unit of the projection optical system to correct the change in the refractive index of the liquid. In addition, a relationship between the aberration and the refractive index is not so clear. The device in JP 2004-301825 projects plural detecting (non-exposure) lights having different wavelengths and incident angles to the substrate, and calculates an amount of the change in the refractive index based on differences from the error amount of the surface position information of each detecting light. Thus, the device in JP 2004-301825 cannot precisely calculate an amount of the refractive index if the refractive index of the liquid changes due to two reasons, i.e., a temperature change and a chemical-structure change. In addition, the detecting light uses the non-exposure light, and the device in this document cannot directly measure the refractive index characteristic and the transmission characteristic of the exposure wavelength.

BRIEF SUMMARY OF THE INVENTION

The present invention is directed to an exposure apparatus that includes a measuring unit for precisely and promptly measuring at least one of an absolute value of the refractive index, an amount of the change in the refractive index, and an amount of the change in the transmittance of the liquid.

An exposure apparatus according to one aspect of the present invention includes an illumination optical system for illuminating a reticle with exposure light, a projection optical system for projecting a pattern of the reticle onto a plate via a liquid supplied to a space between the projection optical system and the plate, and a measuring unit for measuring a refractive index of the liquid, wherein the measuring unit includes a light source for generating a measurement light having the same wavelength as that of the exposure light, a liquid reservoir for storing the liquid, the liquid reservoir having a transmitting surface for transmitting the measurement light and a reflecting surface for reflecting the measurement light, and a detector for detecting the measurement light via the liquid reservoir.

A device manufacturing method according to another aspect of the present invention includes the steps of exposing a plate using the above exposure apparatus, and developing the plate that has been exposed.

Other objects and further features of the present invention will become readily apparent from the following description of the preferred embodiments, with reference to the accompanying drawings.

DETAILED DESCRIPTION OF THE PREFERRED EMBODIMENTS

Figure 1:
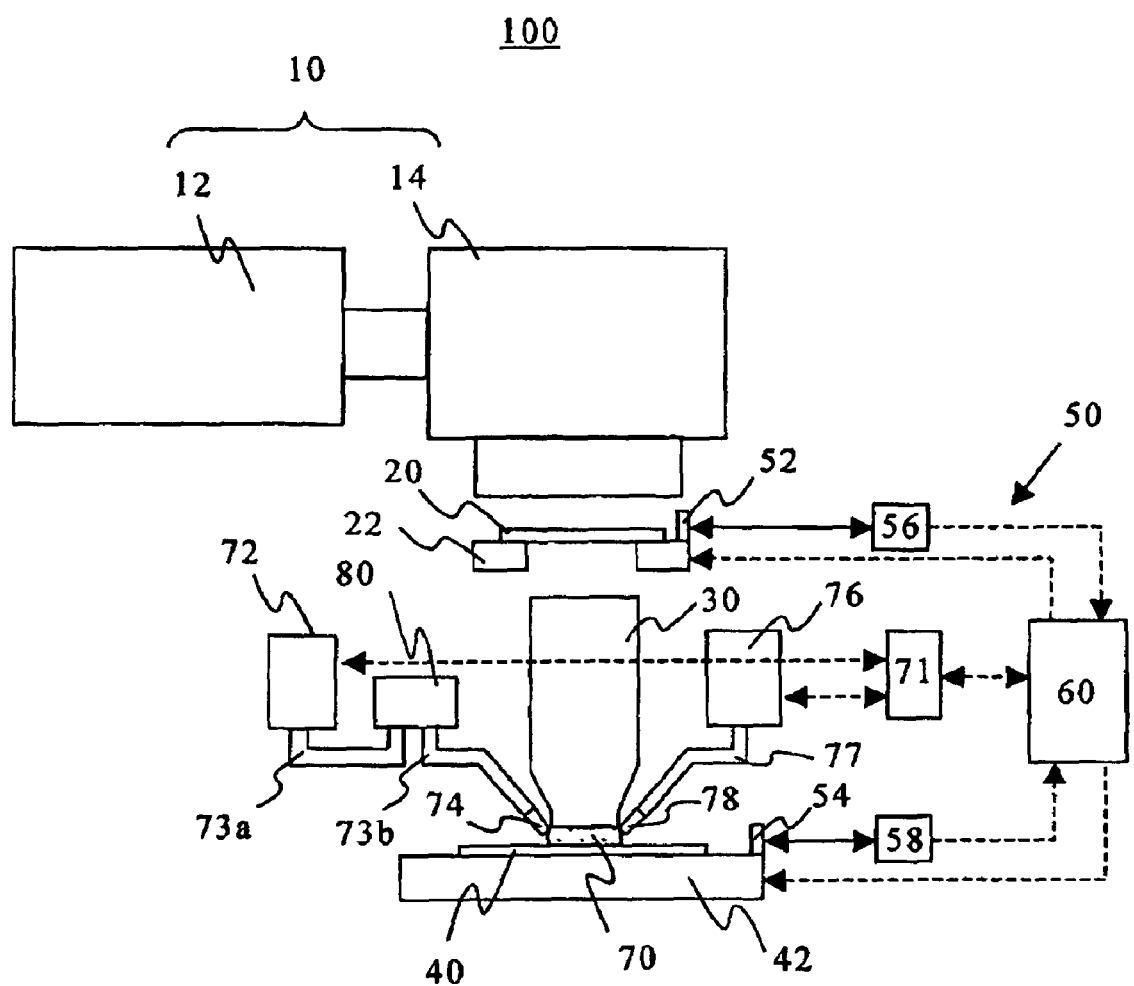
FIG. 1 is a schematic sectional view of a structure of an exposure apparatus according to one aspect of the present invention.

A description will now be given of an exposure apparatus 100 according to one aspect of the present invention, with reference to the accompanying drawings. In each figure, the same element is designated by the same reference numeral, and a duplicate description will be omitted. Here, FIG. 1 is a schematic block diagram of the exposure apparatus 100. The exposure apparatus 100 is an immersion type projection exposure apparatus in which a circuit pattern of a reticle 20 is exposed onto a plate 40 via a liquid 70, which is supplied to a space between the plate 40 and a final surface (of a final optical element) of the projection optical system 30 closest to the plate 40. The exposure apparatus 100 is a step-and-repeat or a step-and-scan exposure apparatus. Of course, the exposure apparatus 100 is applicable to a step-and-repeat manner, and this embodiment discusses the step-and-scan exposure apparatus ("scanner") by way of example.

The exposure apparatus 100 includes an illumination apparatus 10, a reticle stage 22, which is mounted with a reticle 20, a projection optical system 30, a wafer stage 42, which is mounted with a plate 40, a distance-measuring means 50, a stage controller 60, a liquid supply/recovery system, and a measuring unit 80.

The illumination apparatus 10 illuminates a reticle 20 that has a circuit pattern to be transferred, and includes a light source unit 12, and an illumination optical system 14.

The light source unit 12 uses, as a light source, an ArF excimer laser with a wavelength of 193 nm. However, the light source unit 12 is not limited to the ArF excimer laser and may use, for example, a KrF excimer laser with a wavelength of approximately 248 nm, and an $F_2$ laser with a wavelength of approximately 157 nm. In addition, the type of laser and the number of laser units are not limited. A beam shaping system can use, for example, a beam expander, etc., with a plurality of cylindrical lenses. The beam shaping system converts an aspect ratio of the size of the sectional shape of a parallel beam from the laser into a desired value (for example, by changing the sectional shape from a rectangle to a square), thus reshaping the beam shape to a desired one.

The illumination optical system 14 is an optical system that illuminates the reticle 20, and includes a lens, a mirror, an optical integrator, a stop, and the like, for example, in order of a condenser lens, a fly-eye lens, an aperture stop, a condenser lens, a slit and an imaging optical system. The optical integrator may include a fly-eye lens or an integrator formed by stacking two sets of cylindrical lens array plates (or lenticular lenses), and can be replaced with an optical rod, a diffractive element, or a micro-lens-array.

The reticle 20 is fed from outside of the exposure apparatus 100 by a reticle feed system (not shown), and is supported and driven by the reticle stage 22. The reticle 20 is made, for example, of quartz, and has a circuit pattern to be transferred. The diffracted light emitted from the reticle 20 passes the projection optical system 30, and is projected onto the plate 40. The reticle 20 and the plate 40 are located in an optically conjugate relationship. Since the exposure apparatus 100 of this embodiment is a scanner, the reticle 20 and the plate 40 are scanned at a speed ratio of a reduction ratio, thus transferring the pattern on the reticle 20 to the plate 40. For a step-and-repeat exposure apparatus (also referred to as a "stepper"), the reticle 20 and the plate 40 are maintained stationary during exposure.

The reticle 20 may include a pattern generating device, such as a deformable mirror, in addition to a mask having a fixed pattern.

The reticle stage 22 supports the reticle 20 via a reticle chuck (not shown), and its movement is controlled by a moving mechanism (not shown), and the stage controller 60. The moving mechanism (not shown) includes a linear motor, etc., and drives the reticle stage 22 to move the reticle 20 in the desired direction.

The projection optical system 30 is an optical system that serves to image the diffracted light from the pattern of the reticle 20 onto the plate 40. The projection optical system 30 may use a dioptric optical system solely including a plurality of lens elements, and a catadioptric optical system including a plurality of lens elements and at least one mirror, and so on.

The plate 40 is fed from outside of the exposure apparatus 100 by a wafer feed system (not shown), and is supported and driven by the wafer stage 42. The plate 40 is a wafer in this embodiment, but may broadly cover a liquid crystal plate and an object to be exposed. A photoresist is applied onto the plate 40.

The wafer stage 42 supports the plate 40 via a wafer chuck. The wafer stage 42 serves to adjust a position in the vertical or longitudinal direction, a rotational direction and an inclination of the plate 40, under control of the stage controller 60. During exposure, the stage controller 60 controls the wafer stage 42 so that the surface of the plate 40 always accords with the imaging plane of the projection optical system 30 with high precision.

The distance-measuring means 50 (52, 54, 56, 58) measures a position of the reticle stage 22, and a two-dimensional position of the wafer stage 42 on a real-time basis, via reference mirrors 52 and 54, and laser interferometers 56 and 58. The distance measurement result by the distance-measuring means 50 is transmitted to the stage controller 60, and the reticle stage 22 and the wafer stage 42 are driven at a constant speed ratio under control of the stage controller 60 for positioning and synchronous control.

The stage controller 60 controls driving of the reticle stage 22 and the wafer stage 42.

The liquid supply/recovery system supplies the liquid 70 to a space between the projection optical system 30 and the plate 40, and recovers the supplied liquid 70. The liquid supply/recovery system includes an immersion liquid controller 71, a liquid supply unit 72, supply pipes 73*a* and 73*b*, a liquid supply port 74, a liquid recovery unit 76, a recovery pipe 77, and a liquid recovery port 78.

The immersion liquid controller 71 obtains information of the wafer stage 42 from the stage controller 60, such as a current position, speed, acceleration, a target position, and a moving direction, and controls the immersion exposure process based on the information. The immersion liquid controller 71 provides the liquid supply unit 72 and the liquid recovery unit 76 with control commands, such as a switch between supply and recovery of the liquid 70, a stop of the supply of the liquid 70, a stop of the recovery of the liquid 70, and control over the amounts of the supplied or recovered liquid 70.

The liquid supply unit 72 includes a liquid generation means, a liquid purification means, a degasification means, and a temperature control means (not shown in FIG. 1). The liquid supply unit 72 supplies the liquid 70 via the supply pipe 73*b* arranged around a final surface of the projection optical system 30, and forms a liquid in the space between the projection optical system 30 and the plate 40. The space between the projection optical system 30 and the plate 40 preferably has a desired thickness, for example, of 1.0 mm or smaller, enough to stably form and remove the liquid film.

The liquid 70 serves to improve the resolution of the exposure apparatus by shortening the equivalent exposure wavelength of the exposure light from the light source unit 12, or increasing the numerical aperture of the projection optical system 30. The liquid 70 has a high transmittance and high refractive index to the wavelength of the exposure light and is chemically stable to the photoresist applied to the plate 40 and the final surface of the projection optical system 30. The liquid 70 is selected from a material that does not contaminate the final surface of the projection optical system 30 and matches the resist process. The liquid 70 is, for example, pure water, an aqueous solution, an organic solvent, functional water, and a fluorinated solution (such as fluorocarbon), and may be selected in accordance with the resist applied onto the plate 40 and a wavelength of the exposure light.

Use of an aqueous solution (such as $Cs_2SO_4$ and $H_3PO_4$ having a refractive index to the light having a wavelength of 193 nm) and an organic solvent (such as Glycerol™ and n-Decane) for the liquid 70 would increase the NA of the projection optical system 30 and improve the high resolution. The refractive index of the aqueous solution is susceptible to the concentration change of a solute. The organic solvent is likely to change its refractive index as the temperature changes, since the temperature dependency of the refractive index is generally larger than that of water. As described later, this embodiment precisely and promptly measures and corrects the change in the refractive index, and provides stable exposure performance.

The liquid generation means generates the liquid 70 from material water supplied from a material water source (not shown). The liquid purification means reduces contaminants, such as metal ions, fine particles, and organic matter, from the liquid 70 supplied from the liquid generation means. The liquid 70 generated by the liquid generation means and purified by the liquid purification means is supplied to the degasification means. The degasification means degasses the liquid 70, and reduces the concentration of the dissolved gas in the liquid 70, such as the dissolved oxygen and dissolved nitrogen. The degasification means includes, for example, a membrane module and a vacuum pump. The degasification means preferably has a degasification performance of 50% or greater to the saturation state (of about 9 ppm) of the dissolved oxygen and the saturation state (of about 14 ppm) of the dissolved nitrogen in the liquid 70. The temperature control means controls the temperature of the liquid 70 to the desired temperature, such as 23° C., as described later.

The supply pipe 73*a* supplies the liquid 70 to the measuring unit 80 after the degasification means degasses the liquid 70 and the temperature control means controls the temperature of the liquid 70. The liquid 70 that has passed the measuring unit 80 is supplied to the space between the projection optical system 30 and the plate 40.

The liquid recovery unit 76 recovers the liquid 70 that has been supplied to the space between the final surface of the projection optical system 30 and the plate 40, via the recovery pipe 77. The liquid recovery unit 76 includes, for example, a tank that temporarily stores the liquid 70, and a suction unit that sucks the liquid 70. The liquid recovery unit 76 may supply the recovered liquid 70 to the liquid supply unit 72 to circulate the liquid 70.

The measuring unit 80 measures the absolute value of the refractive index, the amount of the change in the refractive index, and the amount of the change in the transmittance of the liquid 70. The measuring unit 80 in this embodiment is arranged on the liquid supply side, but may be arranged, for example, between the liquid recovery port 78 and the liquid recovery unit 76, or may be provided to both the liquid supply side and the liquid recovery side. The measuring unit 80 arranged on the liquid supply side would be able to obtain the information about the refractive index of a pre-exposure or an initial state of the liquid 70 and the information about the refractive index of an exposure state of the liquid 70. For example, it can measure the refractive index of the liquid 70 among supply lots, and the change in the refractive index due to the exposure light irradiation. The measuring unit 80, arranged to the liquid recovery side, would be able to obtain the information about the refractive index of the liquid 70 that changes through the exposure process. For example, the measuring unit 80 provides the information that contains the change in the refractive index due to the interaction between the liquid 70 and the resist (photosensitive material) applied onto the plate 40.

Unlike the device in JP 10-340846, this embodiment does not measure the aberration of the projection optical system 30 in measuring the change in the refractive index of the liquid 70. This embodiment can quickly obtain the information about the change in the refractive index of the liquid 70 (and resultant aberrational information), and promptly correct the refractive index without significantly reducing the throughput. If the change in the refractive index exceeds a desired range, the measuring unit 80 may inform a user of an error or activate one of refractive index correcting means, aberration correcting means, the liquid supply means, and liquid recovery means shown in FIGS. 6 to 8. In addition, unlike the device in JP 2004-301825, this embodiment uses, as the measurement light, not light having a non-exposure wavelength for the measurement light, but light having an exposure wavelength. Hence, this embodiment can precisely measure the amount of the refractive index even when the refractive index of the liquid 70 changes due to two reasons, i.e., the temperature change and the chemical-structure change.

Figure 2:
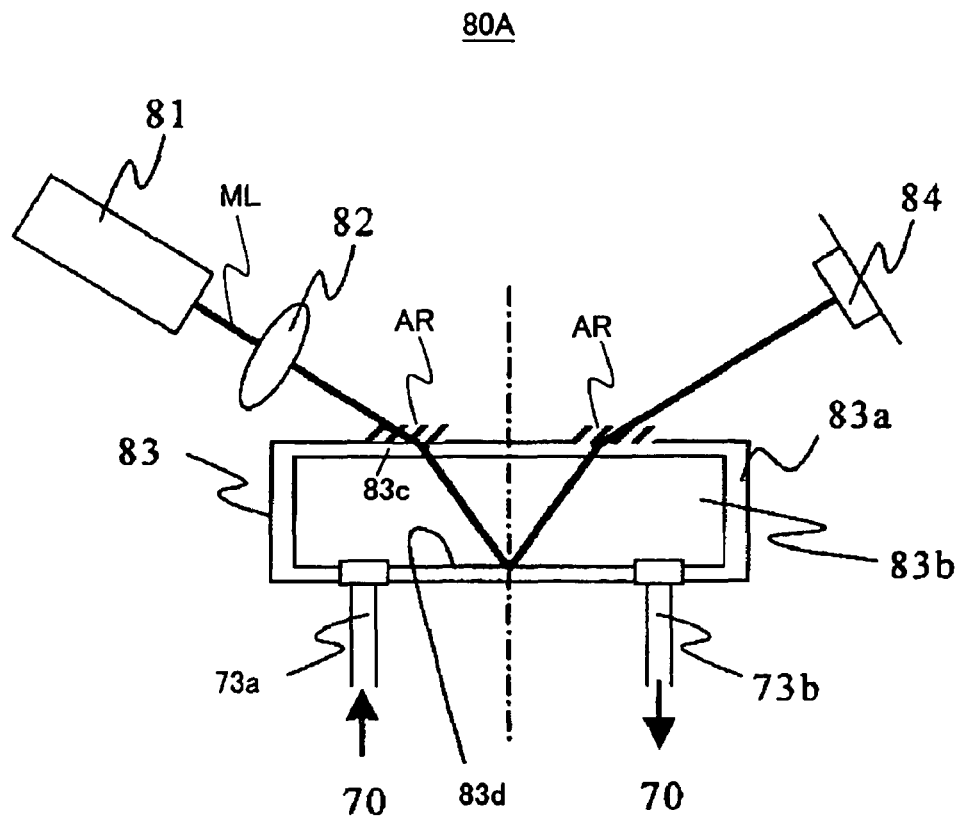
FIG. 2 is a schematic sectional view showing one illustrative structure of a measuring unit of the exposure apparatus shown in FIG. 1.

Referring to FIG. 2, a description will be given of a measuring unit 80A as one illustrative structure of the measuring unit 80. FIG. 2 is a schematic sectional view showing a structure of the measuring unit 80A. The measuring unit 80A includes a light source 81, an illumination optical system 82, a liquid reservoir 83, and a detector 84. The light source 81 is a mercury lamp, a semiconductor laser, a solid laser, a gas laser, etc., and the measurement light ML from the light source 81 enters the liquid reservoir 83. The light source 81 generates a light having the same wavelength as that of the exposure light, and is preferably the same light source as or has a similar specification (in wavelength, repetition rate, energy output, and spectral bandwidth) to the exposure light source. When the wavelength of the measurement light ML has the same wavelength of the exposure light, the measuring unit 80A can measure the refractive index of the liquid 70 with a real (or an exposure) condition.

The illumination optical system 82 introduces the measurement light ML from the light source 81 to the liquid 70 as a target to be detected, which is filled in the liquid reservoir 83. The illumination optical system 82 includes plural lenses, and controls the light intensity of the measurement light ML that enters the liquid 70, so that the light intensity is equal to that of the exposure light irradiated onto the plate 40. The illumination optical system 82 can control a polarization state of the measurement light ML that enters the liquid 70 to a desired polarization state (or the illumination optical system 82 serves as the polarization control means), so that the polarization state is equal to that of the exposure light irradiated onto the plate 40. When the light intensity and polarization state of the measurement light ML for measuring the refractive index of the liquid 70, are made equal to those of the exposure light on the plate 40, the information about the refractive index of the liquid 70 that takes, for example, both the temperature change and chemical-structure change of the liquid 70 into account, can be obtained.

The liquid reservoir 83 is supplied with the liquid 70 via the supply pipe 73a and recovers the supplied liquid 70 via the supply pipe 73b. It is preferable that the supply/recovery timings of the liquid 70 to/from the liquid reservoir 83 are in synchronization with the supply/recovery timings of the liquid 70 to/from the plate 40 (or the space between the final surface of the projection optical system 30 and the plate 40).

Thus, the measurement condition of the liquid 70 in the liquid reservoir 83 is set close to the exposure condition (in wavelength, light intensity (on the image plane), polarization state, illumination area (i.e., the illumination size and a thickness of the liquid 70), and liquid supply/recovery timings) of the liquid 70 on the plate 40. This configuration can precisely obtain the information about the refractive index of the liquid 70, and control the supply/recovery timings of the liquid 70 even when the refractive index changes for plural reasons, and when plural types of liquid are used.

The liquid reservoir 83 has a reservoir 83b that stores or reserves the liquid 70. In the liquid reservoir 83, a transmitting surface 83c that transmits the measurement light ML is set to be parallel to a bottom (reflecting) surface 83d that reflects the measurement light ML. A base 83a is made of a transparent material, such as a quartz glass, to a wavelength of the measurement light ML from the light source 81. An incident angle of measurement light ML to the liquid reservoir 83 is a desired angle, which is preferably as large as possible. The liquid reservoir 83 preferably has an antireflection coating AR on the incident surface that the measurement light ML is transmitted through. In addition, the liquid reservoir 83 preferably has a reflection coating on the bottom surface 83d that reflects the measurement light ML. The measurement light ML that enters the liquid reservoir 83 is transmitted through the transmitting surface 83c, is refracted due to the liquid 70 filled in the liquid reservoir 83, is reflected on the bottom surface 83d, and enters the detector 84. Similarly, the liquid reservoir 83 has the antireflection coating AR on the transmitting surface through which the measurement light ML exits.

Preferably, an output of the detector 84 is sensitive to a light incident position and uses, for example, a split detector. The detector 84 may obtain an electrical signal in accordance with the incident position when the split detector is combined with a differential amplifier. Instead of the differential amplifier, a differential signal may be digitally synthesized from each output of the split detector. The detector 84 may use a position sensitive detector. The detector 84 may realize an equivalent split detector by combining the beam splitter and plural photodetectors. As described later, one of the detectors 84 may use a light intensity detector so as to detect the change in the transmittance of the liquid 70.

Figure 3:
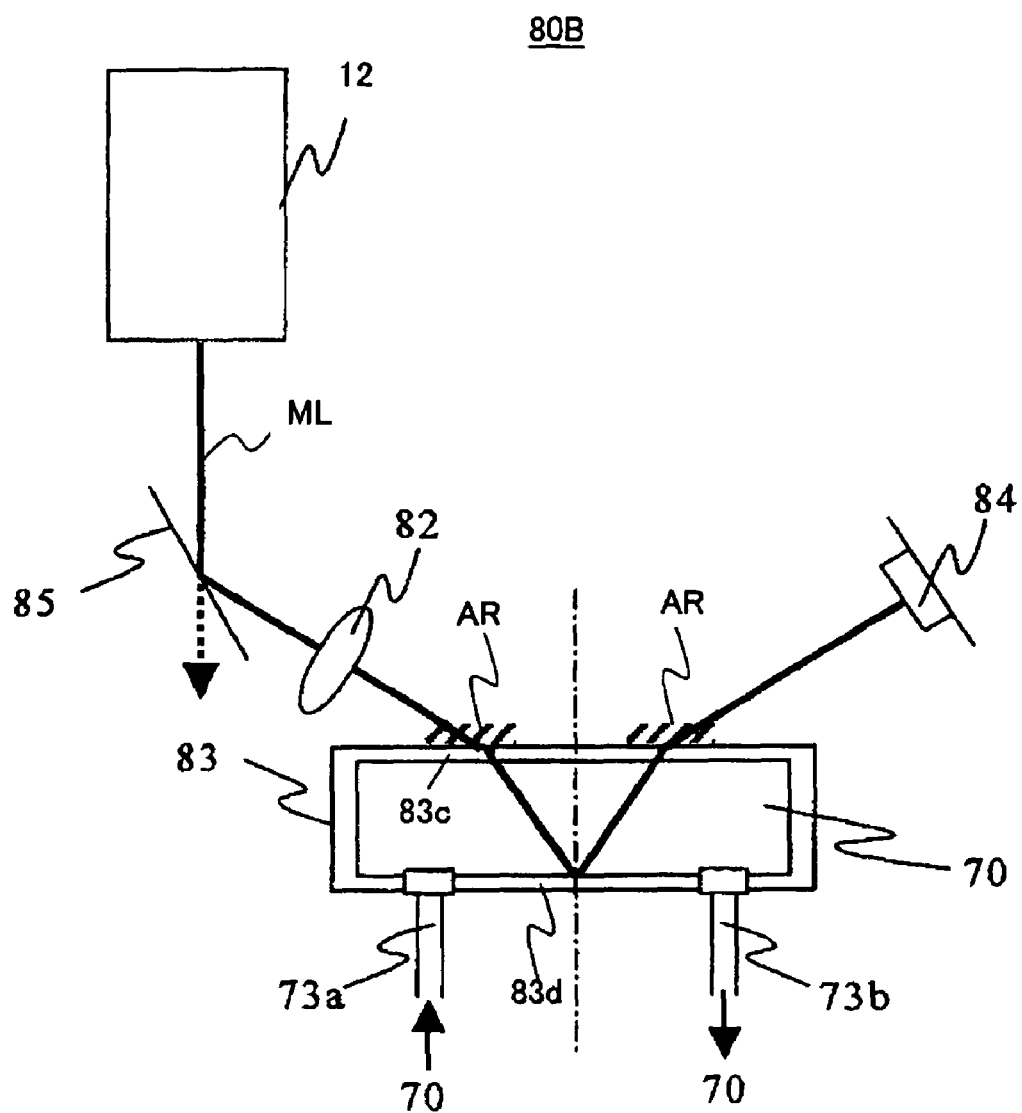
FIG. 3 is a schematic sectional view showing a structure of a variation of the measuring unit shown in FIG. 2.

In the measuring unit 80A, as the refractive index of the liquid 70 changes, the refractive angle in the liquid 70 changes. Thereby, the light incident position upon the detector 84 changes, and an output of the detector 84 changes. The change in the refractive index of the liquid 70 is measurable from an output of the detector 84. The change in the refractive index of the liquid 70 may be calculated from a preset relational equation, or a table (or database) obtained from the experiment or simulation results. When the absolute value of the refractive index before the change is known, the absolute value of the refractive index after the change may be obtained. While the detector 84 in this embodiment detects the measurement light ML that is reflected on the bottom surface 83d of the liquid reservoir 83, the detector 84 may detect the measurement light ML that is transmitted through the bottom surface 83d. When the detector 84 detects the measurement light ML that is reflected on the bottom surface 83d, the optical path length in the liquid 70 of the measurement light ML is doubled in comparison with the case to detect the measurement light ML that is transmitted through the bottom surface 83d, and the measurement precision of the refractive index of the liquid 70 improves. The detecting precision of the detector 84 and, thus, the measuring precision of the refractive index of the liquid 70 improve when the incident angle of the measurement light ML to the reflecting surface 83d is made as large as possible. Referring to FIG. 3, a description will be given of a measuring unit 80B as a variation of the measuring unit 80A. FIG. 3 is a schematic sectional view of a structure of the measuring unit 80B that utilizes the light from the light source section 12 of the exposure apparatus 100 (or the exposure light from the exposure light source). The (exposure) light from the light source section 12 is split by a beam splitter 85, and one of them (or the measurement light ML) enters the liquid reservoir 83. An illumination optical system 82 is arranged in an optical path between the light source section 12 and the liquid reservoir 83. Since the measuring unit 80B uses the exposure light for the measurement light ML, the measurement condition of the liquid 70 in the liquid reservoir 83 can be set close to the exposure condition of the liquid 70 above the plate 40.

Figure 4:
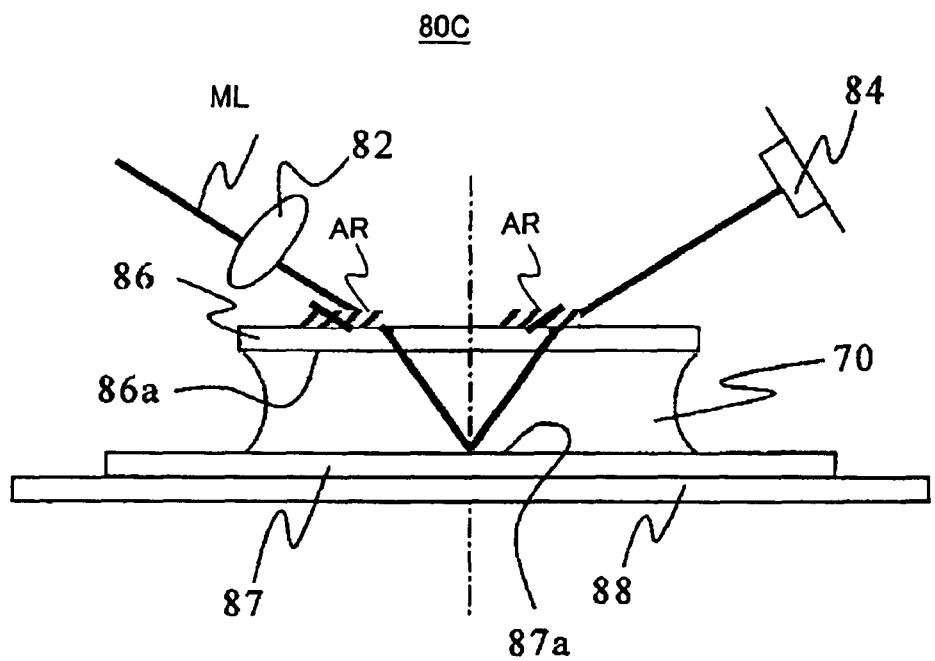
FIG. 4 is a schematic sectional view showing a structure of another variation of the measuring unit shown in FIG. 2.

Referring to FIG. 4, a description will be given of a measuring unit 80C as a variation of the measuring unit 80A. FIG. 4 is a schematic sectional view of a structure of the measuring unit 80C as another variation of the measuring unit 80A. In FIG. 4, the measurement light ML enters a plane-parallel plate 86 via the illumination optical system 82. The plane-parallel plate 86 preferably has an antireflection coating AR on the incident surface that the measurement light ML is transmitted through. A liquid supply pipe (not shown) supplies the liquid 70 to a space between the plane-parallel plate 86 and the substrate 87 that is arranged on a stage 88 and has a reflecting surface 87*a*, and a liquid recovery pipe (not shown) recovers the liquid 70 from the space. Preferably, the supply/recovery timings of the liquid 70 to/from the space between the plane-parallel plate 86 and the substrate 87 are in synchronization with the supply/recovery timings of the liquid 70 to/from the plate 40 (or the space between the final surface of the projection optical system 30 and the plate 40).

The plane-parallel plate 86 is arranged parallel to the reflecting surface 87*a* of the substrate 87, and is made of a transparent material, such as quartz glass, to a wavelength of the light source. The incident angle of the light to the plane-parallel plate 86 is a desired angle, which is preferably as large as possible. The measurement light ML that is incident upon the plane-parallel plate 86 is transmitted through a transmitting surface 86*a*, is refracted due to the liquid 70 filled in a space between the plane-parallel plate 86 and the substrate 87, is reflected on the reflecting surface 87*a* on the substrate 87, and enters the detector 84. The plane-parallel plate 86 preferably has an antireflection coating AR on the transmitting surface which the measurement light ML exits.

In the measuring unit 80C, as the refractive index of the liquid 70 changes, the refractive angle in the liquid 70 filled in the space between the plane-parallel plate 86 and the substrate 87 changes. Thereby, the light incident position upon the detector 84 changes, and an output of the detector 84 changes. The change in the refractive index of the liquid 70 is measurable from the output of the detector 84. When the detector 84 uses a light intensity detector, the change in the transmittance of the liquid 70 can be detected.

A stage 88 that holds the substrate 87 has an adjusting mechanism that adjusts a position in the normal direction to the substrate 87, and can adjust a positional relationship between the bottom surface 86*a* of the plane-parallel plate 86 and the reflecting surface 87*a* of the substrate 87, i.e., a thickness of the liquid 70. The measuring unit 80C adjusts or controls the thickness of the liquid 70, and sets the measurement condition of the liquid 70 in the liquid reservoir 83 close to the exposure condition in the liquid 70 above the plate 40. This configuration can precisely obtain the information about the refractive index of the liquid 70 and can control the supply/recovery timings of the liquid 70 even when the refractive index changes for plural reasons, and when plural types of liquid are used.

Figure 5:
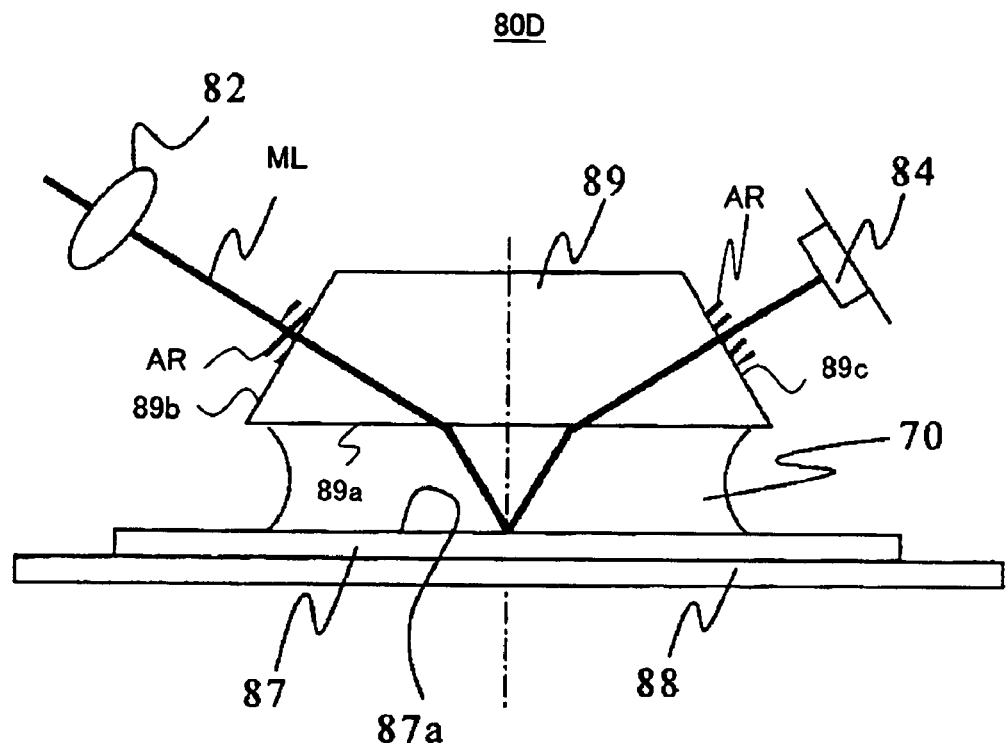
FIG. 5 is a schematic sectional view showing a structure of a variation of the measuring unit shown in FIG. 4.

Referring to FIG. 5, a description will be given of a measuring unit 80D as a variation of the measuring unit 80C. FIG. 5 is a schematic sectional view of a structure of the measuring unit 80D as a variation of the measuring unit 80C. While FIG. 5 shows a trapezoidal prism by way of example, an inverse trapezoidal prism may be used. The measuring unit 80D arranges a prism 89 instead of the plane-parallel plate 86. In FIG. 5, the measurement light ML enters the prism 89 via the illumination optical system 82. The prism 89 preferably has an antireflection coating AR on the incident surface 89*b* that the measurement light ML is transmitted through. Liquid supply pipes 73*a* and 73*b* supply/recover the liquid 70 to/from a space between the prism 89 and the substrate 87, which is arranged on the stage 88 and has a reflecting surface 87*a*. Preferably, the supply/recovery timings of the liquid 70 to/from the space between the prism 89 and the substrate 87 are in synchronization with the supply/recovery timings of the liquid 70 to/from the plate 40 (or the space between the projection optical system 30 and the plate 40).

The transmitting surface 89*a* of the prism 89 is arranged to be parallel to the reflecting surface 87*a* of the substrate 87, and is made of a transparent material, such as quartz glass, to a wavelength of the measurement light ML. The light enters approximately perpendicular to the incident surface 89*b* of the prism 89. The incident angle of the light to the transmitting surface 89*a* of the prism 89 is a desired angle, which is preferably as large as possible. The measurement light ML that enters the prism 89 is transmitted through the transmitting surface 89*a*, is refracted due to the liquid 70 filled in the space between the prism 89 and the substrate 87, is reflected on the reflecting surface 87*a* on the substrate 87, and enters the detector 84. The prism 89 preferably has an antireflection coating AR on the transmitting surface 89*c*, which the measurement light ML exits. The measuring unit 80D can increase the refractive angle in the liquid 70 greater than that of the measuring unit 80C, and can measure the change in the refractive index of the liquid 70 more precisely than the measuring unit 80C.

The measuring unit 80 prefers a larger incident angle of the measurement light ML to the bottom (reflecting) surface of the liquid reservoir. Thereby, the measuring unit 80 may precisely measure the change in the refractive index of the liquid 70. Referring now to FIGS. 11 to 23, a description will be given of the measuring units 80E to 80J that can set an incident angle of the measurement light ML to the bottom (reflecting) surface of the liquid reservoir 83 greater than the measuring units 80A to 80D.

Figure 11:
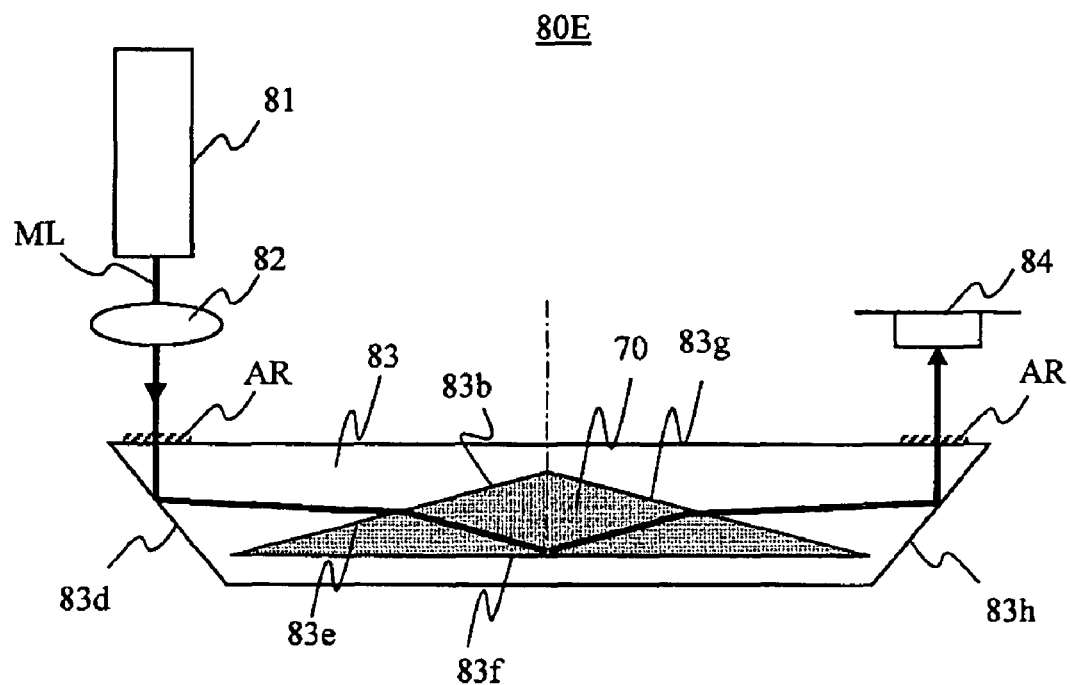
FIG. 11 is a schematic sectional view showing a structure of a variation of the measuring unit shown in FIG. 2.

FIG. 11 is a schematic sectional view of a structure of the measuring unit 80E as a variation of the measuring unit 80A. In the measuring unit 80E, the measurement light ML from the light source 81 enters the liquid reservoir 83 via the illumination optical system 82. The liquid reservoir 83 preferably has an antireflection coating AR on an incident surface that the measurement light ML is transmitted through. The measurement light ML that enters the liquid reservoir 83 is (totally) reflected on a side surface 83*d* of the liquid reservoir 83, is transmitted through a (first) transmitting surface 83*e*, and enters the liquid 70 in the liquid reservoir 83.

Figure 12:
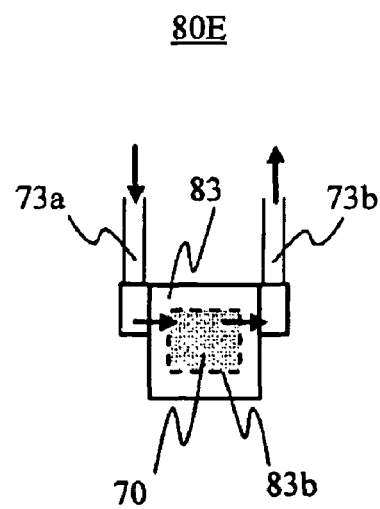
FIG. 12 is a schematic top view of the measuring unit shown in FIG. 11.

As shown in FIG. 12, the liquid reservoir 83 is supplied with the liquid 70 via the supply pipe 73*a*. The recovery pipe 73*b* recovers the supplied liquid 70. An arrow in FIG. 12 denotes a direction of the flow of the liquid 70. Here, FIG. 12 is a schematic top view of the measuring unit 80E, and has an orthogonal relationship with FIG. 11.

The measurement light ML that enters the liquid 70 is refracted in the liquid 70 filled in the liquid reservoir 83, and reflected on a reflecting surface 83*f* on the liquid reservoir 83. The measurement light ML reflected on the reflecting surface 83*f* is transmitted through a (second) transmitting surface 83*g*, is (totally) reflected on a side surface 83*h* of the liquid reservoir 83, and enters the detector 84. The liquid reservoir 83 preferably has an antireflection coating AR on the transmitting surface, which the measurement light ML exits.

Figure 13:
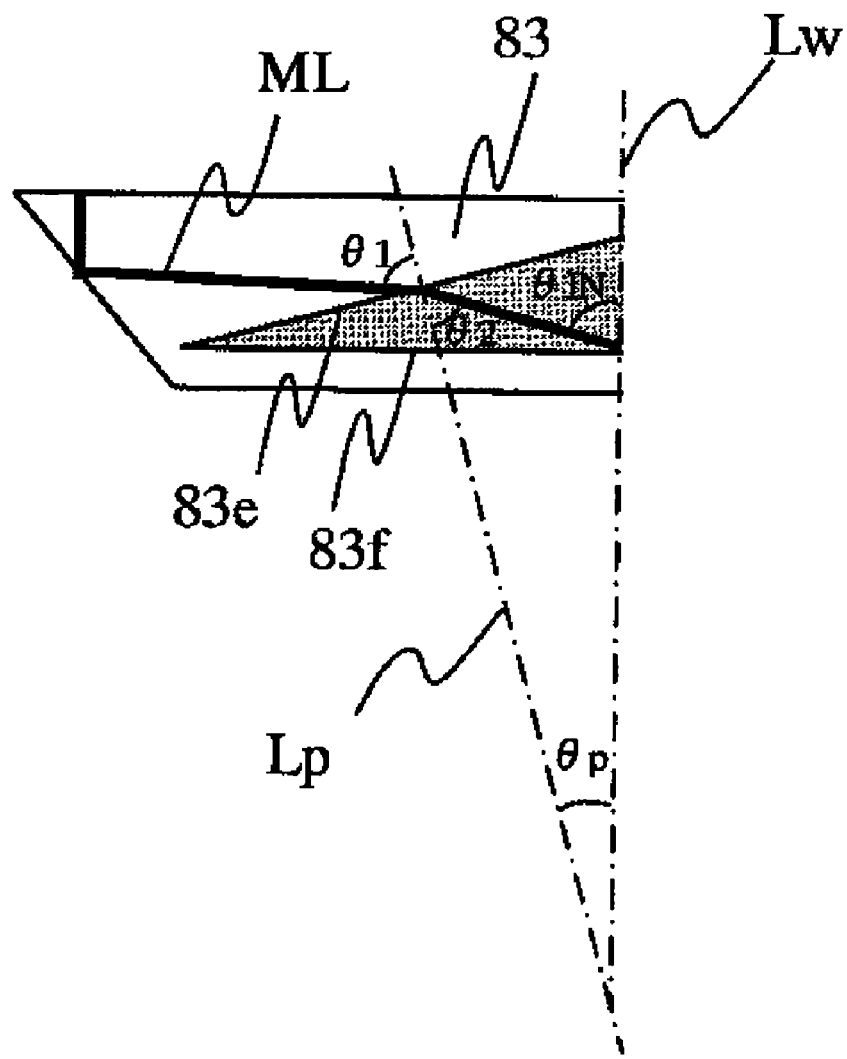
FIG. 13 is an enlarged view of a reservoir in a liquid reservoir shown in FIG. 11.

A reflecting surface 83*f* is arranged non-parallel to the transmitting surfaces 83*e* and 83*g*. Referring to FIG. 13, a description will be given of an arrangement between the reflecting surface 83*f* and the transmitting surfaces 83*e* and 83*g*. Since the arrangement between the reflecting surface 83*f* and the transmitting surface 83*e* is the same as that between the reflecting surface 83*f* and the transmitting surface 83*g*, this embodiment discusses only the arrangement between the reflecting surface 83*f* and the transmitting surface 83*e*, by way of example. Here, FIG. 13 is an enlarged view of the reservoir 83*b* of the liquid reservoir 83 shown in FIG. 11.

In FIG. 13, Lp denotes a normal to the transmitting surface 83*e*, and Lw denotes a normal to the reflecting surface 83*f* in the liquid reservoir 83. In this figure, θ1 denotes an incident angle of the measurement light ML to a boundary plane (transmitting surface 83e) between the liquid reservoir 83 and the liquid 70, and θ2 denotes a refractive angle of the measurement light ML to a boundary plane (transmitting surface 83e) between the liquid reservoir 83 and the liquid 70. Also, θIN is an incident angle of the measurement light ML to the reflecting surface 83f, n1 denotes a refractive index of the liquid reservoir 83, and n2 denotes a refractive index of the liquid 70.

Equation 1 below is met from Snell's law in the boundary plane (transmitting surface 83e) between the liquid reservoir 83 and the liquid 70:

$$n1 \times \sin(\theta 1) = n2 \times \sin(\theta 2).\quad [\text{EQUATION 1}]$$

When the transmitting surface 83e is parallel to the reflecting surface 83f and the refractive index n1 of the liquid reservoir 83 is greater than the refractive index n2 of the liquid 70, the angle of the measurement light ML to the transmitting surface 83e (or reflecting surface 83f) can be made maximum.

On the other hand, when the transmitting surface 83e is parallel to the reflecting surface 83f and the refractive index n1 of the liquid reservoir 83 is smaller than the refractive index n2 of the liquid 70, the angle of the measurement light ML to the transmitting surface 83e (or reflecting surface 83f) is limited by the refractive index of the liquid reservoir 83. Therefore, the angle of the measurement light ML to the reflecting surface 83f cannot be made maximum.

The measuring unit 80E in the exposure apparatus 100 in this embodiment is characterized in that an angle between the normal Lp to the transmitting surface 83e and the normal Lw to the reflecting surface 83f is greater than 0° in the liquid reservoir 83. In other words, the transmitting surface 83e of the liquid reservoir 83 is arranged non-parallel to the opposing reflecting surface 83f via the liquid 70. In addition, characteristically, the normal to the transmitting surface 83e intersects with the normal to the transmitting surface 83g under the transmitting surface 83e or at the side of the reflecting surface 83f. Here, Equation 2 below is met, where θp is an angle between the normal Lp and the normal Lw:

$$\theta IN = \theta 2 + \theta p.\quad [\text{EQUATION 2}]$$

Therefore, in the measuring unit 80E, even when the refractive index n1 of the liquid reservoir 83 is smaller than the refractive index n2 of the liquid, the angle θp between the normal Lp and the normal Lw is set to be greater than zero, and the transmitting surface 83e is made non-parallel to the reflecting surface 83f in the liquid reservoir 83. Thereby, the measuring unit 80E can make the incident angle of the measurement light ML to the reflecting surface 83f, rather than the measuring units 80A to 80D, in which the transmitting surface is parallel to the reflecting surface (θp=0). In other words, the measuring unit 80E can more precisely measure the amount of the change in the refractive index of the liquid 70 than the measuring units 80A to 80D. In this embodiment, the transmitting surfaces 83e and 83g are plane (or have a triangular section), but they may have a curved surface (such as a semicircular sectional shape) as long as they are non-parallel to the reflecting surface 83f.

Figure 14:
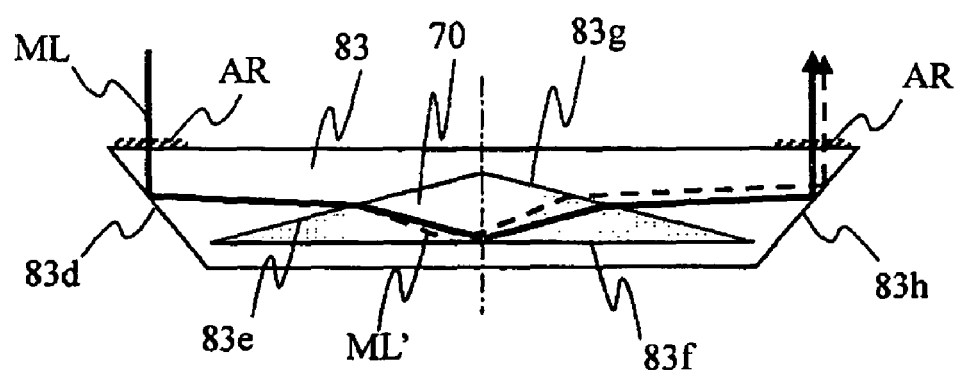
FIG. 14 is a view showing an optical path change of measurement light when the refractive index of the liquid changes in the measuring unit shown in FIG. 11.

FIG. 14 is a view showing an optical path change of the measurement light ML when the refractive index of the liquid 70 changes. In FIG. 14, a solid line ML denotes an optical path of the measurement light ML before the refractive index of the liquid 70 changes, and a broken line denotes an optical path of the measurement light ML' after the refractive index of the liquid 70 has changed. Referring to FIG. 14, when the refractive index of the liquid 70 changes, the refractive angle in the liquid 70 filled in the liquid reservoir 83 changes (like the broken line ML'), and the incident position of the measurement light ML upon the detector 84 changes (like the broken line ML'). Therefore, an output of the detector 84 changes, and the measuring unit 80E can measure the amount of the change in the refractive index of the liquid 70 based on the output of the photodetector 84.

When the information obtained by the measuring unit 80E (measuring result) is fed back to the immersion liquid controller 71, the supply timing of the liquid 70 by the liquid supply unit 72 and the recovery timing of the liquid 70 by the liquid recovery unit 76 can be controlled. This control is particularly effective when the liquid 70 has a high refractive index liquid. When pure water is applied to the liquid 70, the pure water can always be supplied and recovered for each shot, since pure water is inexpensive. On the other hand, when a high refractive index liquid is used for the liquid 70, a system that always supplies and recovers the high refractive index liquid for each shot may be impracticable in view of its cost of the high refractive index liquid. In that case, the optical characteristic of the (high refractive index) liquid 70 is measured in a real-time basis, and it is necessary to control the supply/recovery timings of the liquid 70.

Figure 15:
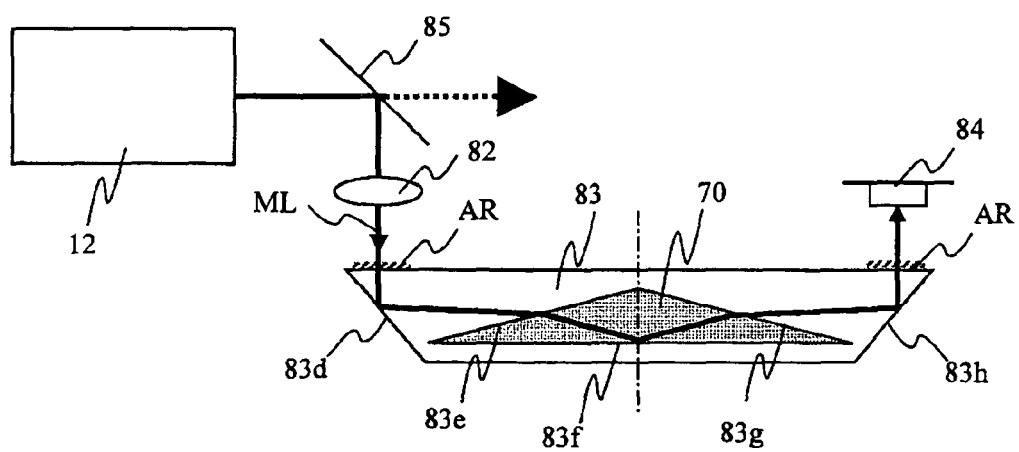
FIG. 15 is a schematic sectional view showing a structure of a variation of the measuring unit shown in FIG. 11.

Referring to FIG. 15, a description will be given of the measuring unit 80F as a variation of the measuring unit 80E. FIG. 15 is a schematic sectional view showing a structure of the measuring unit 80F that utilizes the light from the light source section 12 of the exposure apparatus 100 (or the exposure light from the exposure light source). The (exposure) light from the light source section 12 is split by a beam splitter 85, and one of them (or the measurement light ML) enters the liquid reservoir 83. An illumination optical system 82 is arranged in an optical path between the light source section 12 and the liquid reservoir 83. The measuring unit 80F can precisely measure and correct the amount of the change in the refractive index of the liquid 70, even when the refractive index changes for plural reasons, and when plural types of liquid are used.

Figure 16:
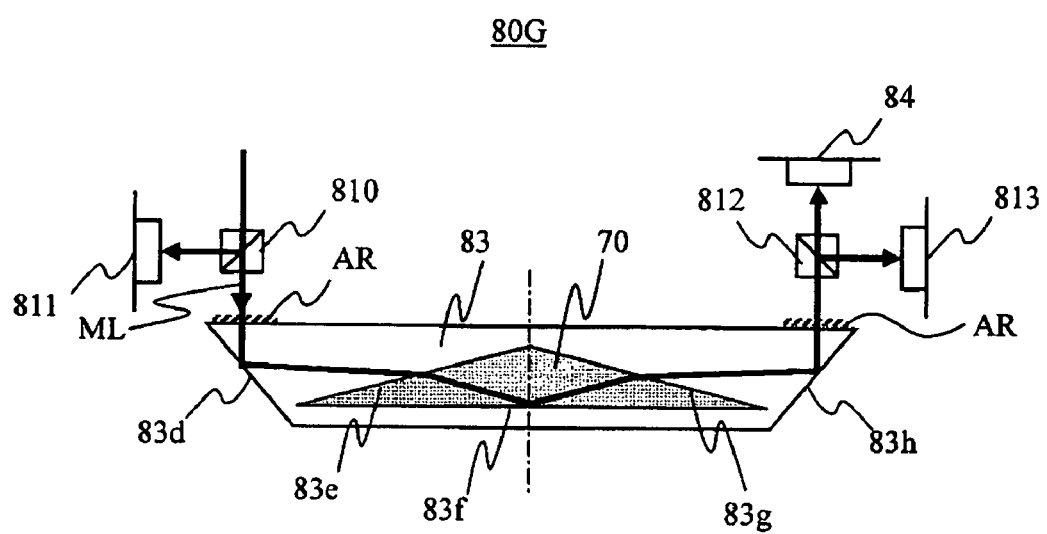
FIG. 16 is a schematic sectional view showing a structure of a variation of the measuring unit shown in FIG. 15.

Referring to FIG. 16, a description will be given of the measuring unit 80G as a variation of the measuring unit 80F. FIG. 16 is a schematic sectional view showing a structure of the measuring unit 80G as a variation of the measuring unit 80F. The measuring unit 80G arranges a beam splitter 810 and a photodetector 811 just before the liquid reservoir 83 viewed from the measurement light ML, and arranges a beam splitter 812 and a photodetector 813 just after the liquid reservoir 83 when viewed from the measurement light ML.

In the measuring unit 80G, the beam splitters 810 and 812 split the measurement light ML into two lights, and these two lights enter the photodetectors 811 and 813. Outputs of the photodetectors 811 and 813 are preferably sensitive to the light intensity of the light, and the photodetectors 811 and 813 use, for example, a power meter.

The measuring unit 80G can measure the amount of the change in the transmittance of the liquid 70 to the measurement light ML (exposure light) on a real-time basis by detecting the change of the light intensity. From the measurement result of the change in the transmittance of the liquid 70, it is possible to infer the light irradiation durability of the liquid 70 to the measurement light ML, which is caused by the chemical structure change due to the exposure light irradiation. Similarly, it is possible to infer the concentration change of the dissolved gas in the liquid 70, which is caused by the increase of the absorption of the liquid 70 due to the increase of the dissolved oxygen, etc., into the liquid 70. The refractive index of the liquid 70 can be measured precisely when the change in the transmittance of the liquid 70 is fed back to the measurement result by the measuring unit 80G.

Figure 17:
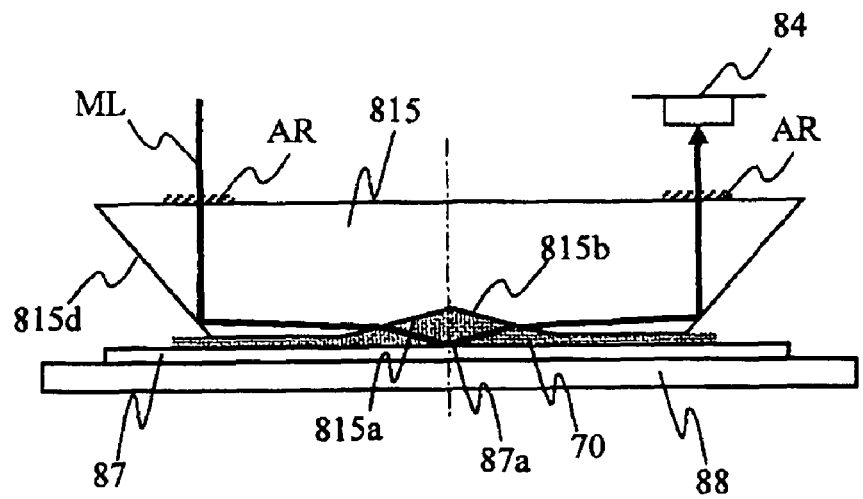
FIG. 17 is a schematic sectional view showing a structure of another variation of the measuring unit shown in FIG. 11.
Figure 18:
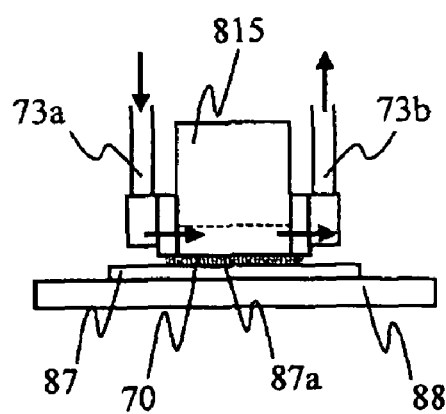
FIG. 18 is a schematic top view of the measuring unit shown in FIG. 17.

Referring to FIGS. 17 and 18, a description will be given of the measuring unit 80H as a variation of the measuring unit 80E. FIG. 17 is a schematic sectional view showing a structure of the measuring unit 80H as a variation of the measuring unit 80E. FIG. 18 is a schematic top view of the measuring unit 80H, which has an orthogonal relationship with FIG. 17.

The measuring unit 80H includes the substrate 87 that is arranged on the stage 88 and has the reflecting surface 87a, and a prism 815 that has transmitting surfaces 814a and 815b that are arranged non-parallel to the reflecting surface 87a. The prism 815 is made of a transparent material to the wavelength of the measurement light ML, such as quartz glass. As shown in FIG. 18, the liquid 70 is supplied to a space between the prism 815 and the substrate 87 arranged on the stage 88 via the supply pipe 73a. The recovery pipe 73b recovers the supplied liquid 70. An arrow in FIG. 18 denotes a flow of the liquid 70.

In the measuring unit 80H, the measurement light ML enters the prism 815 via the illumination optical system (not shown). The prism 815 preferably has an antireflection coating AR on an incident surface that the measurement light ML is transmitted through. The measurement light ML that enters the prism 815 is (totally) reflected on a side surface 815d of the prism 815, is transmitted through a transmitting surface 815a, and enters the liquid 70 that is filled in a space between the prism 815 and the substrate 87.

The measurement light ML that enters the liquid 70 is refracted in the liquid 70 filled in the space between the prism 815 and the substrate 87, is reflected on a reflecting surface 87a on the substrate 87, is transmitted through the transmitting surface 815b, and enters the detector 84. The prism 815 preferably has an antireflection coating AR on the transmitting surface, which the measurement light ML exits. Similar to the measuring unit 80E, the reflecting surface 87a is arranged non-parallel to the transmitting surfaces 815a and 815b in the prism 815.

Figure 19:
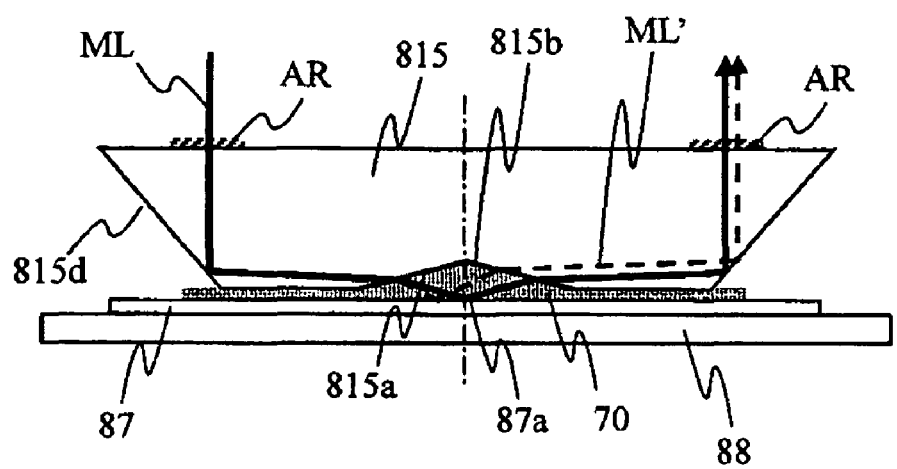
FIG. 19 is a view showing an optical path change of a measurement light when the refractive index of the liquid changes in the measuring unit shown in FIG. 17.

FIG. 19 is a view showing an optical path change of the measurement light ML when the refractive index of the liquid 70 changes. In FIG. 19, a solid line ML denotes an optical path of the measurement light ML before the refractive index of the liquid 70 changes, and a broken line denotes an optical path of the measurement light ML' after the refractive index of the liquid 70 has changed. Referring to FIG. 19, when the refractive index of the liquid 70 changes, the refractive angle in the liquid 70 filled in the space between the prism 815 and the substrate 87 changes (like the broken line ML'), and the incident position of the measurement light ML upon the detector 84 changes (like the broken line ML'). Therefore, an output of the detector 84 changes, and the measuring unit 80H can measure the amount of the change in the refractive index of the liquid 70 based on the output of the photodetector 84.

Figure 20:
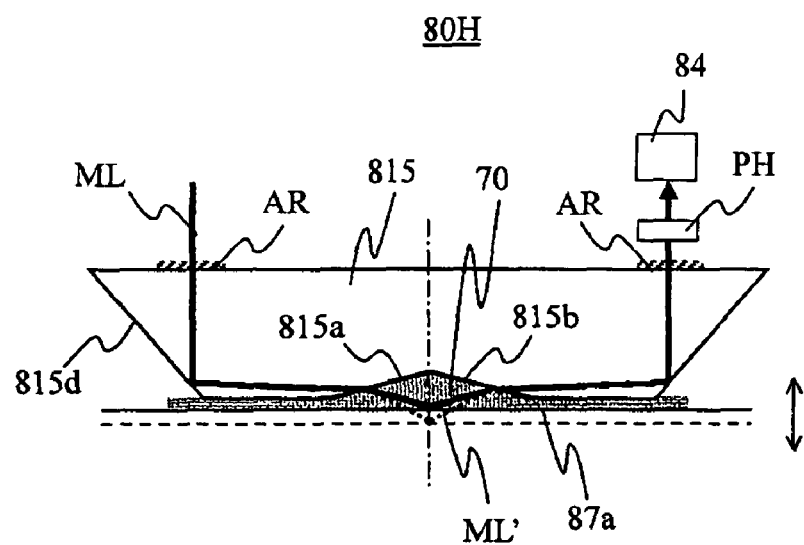
FIG. 20 is a view showing an optical path change of a measurement light when the refractive index of the liquid changes in the measuring unit shown in FIG. 17.

As shown in FIG. 20, the amount of the change in the refractive index of the liquid 70 can be measured by driving the substrate 87 (or the reflecting surface 87a) in the normal direction (or longitudinal direction). Here, FIG. 20 is a view showing an optical path change of the measurement light ML when the refractive index of the liquid 70 changes.

Referring to FIG. 20, when the refractive index of the liquid 70 changes, the refractive angle in the liquid 70 changes (like the broken line ML'), and the incident position of the measurement light ML upon the detector 84 changes (like the broken line ML'). In FIG. 20, a driving mechanism of the stage 88 controls a position of the reflecting surface 87a of the substrate 87, and the reflecting surface 87a is driven so that an output of the detector 84 accords with an output before the refractive index changes. Thereby, the amount of the change in the refractive index of the liquid 70 can be measured from the information about the driving amount of the reflecting surface 87a of the substrate 87. As shown in FIG. 20, a pinhole PH may be arranged between the transmitting surface of the prism 815 for the measurement light ML and the detector 84.

Figure 21:
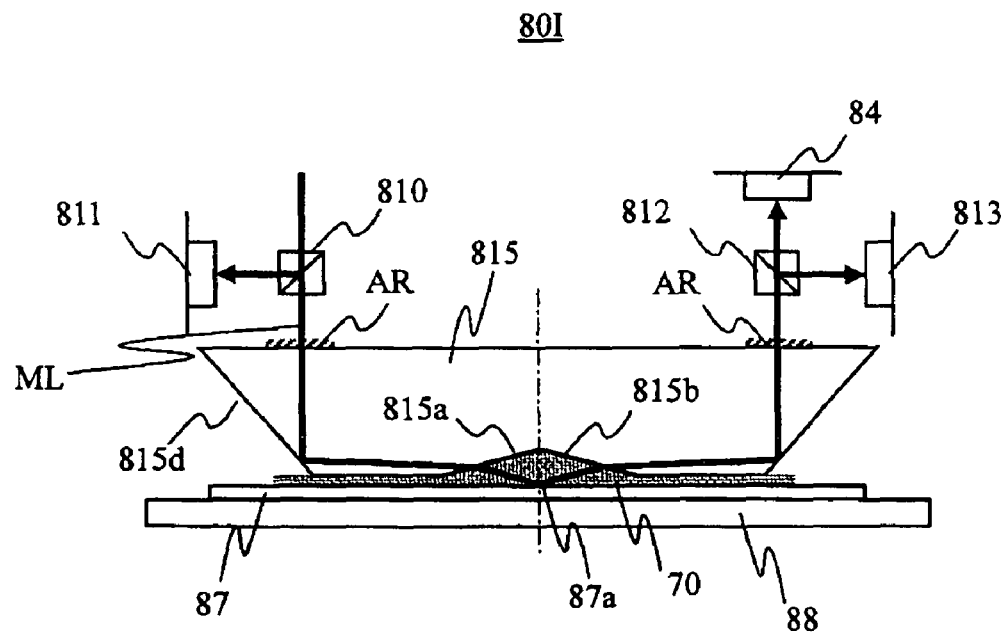
FIG. 21 is a schematic sectional view showing a structure of a variation of the measuring unit shown in FIG. 17.

Referring to FIG. 21, a description will be given of the measuring unit 80I as a variation of the measuring unit 80H. FIG. 21 is a schematic sectional view showing a structure of the measuring unit 80I as a variation of the measuring unit 80H. The measuring unit 80I arranges a beam splitter 810 and a photodetector 811 just before the prism 815 viewed from the measurement light ML, and arranges a beam splitter 812 and a photodetector 813 just after the prism 815 viewed from the measurement light ML.

In the measuring unit 80I, the beam splitters 810 and 812 split the measurement light ML into two lights, and these two lights enter the photodetectors 811 and 813. The measuring unit 80I detects the light intensity of the measurement light ML, and thus, the change in the transmittance of the measurement light ML (exposure light) to the liquid 70 in a real-time basis.

Figure 22:
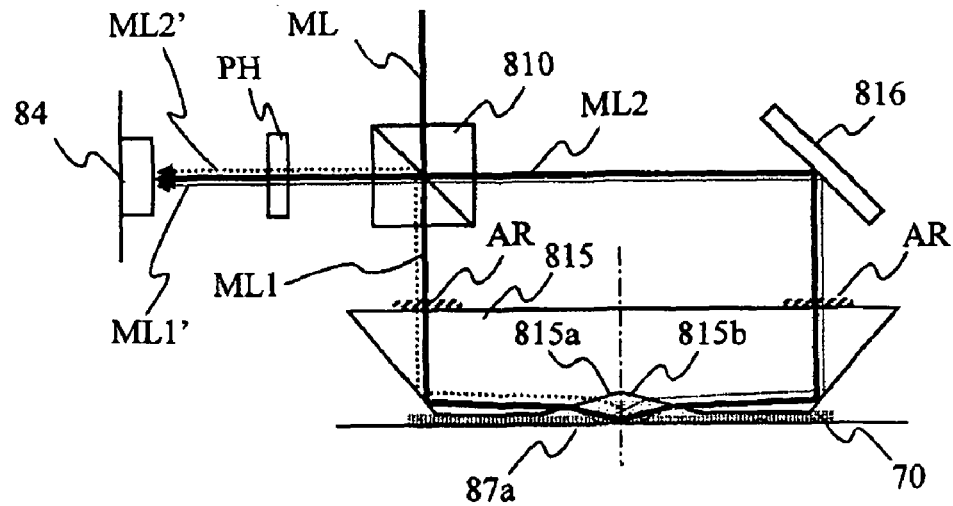
FIG. 22 is a schematic sectional view showing a structure of another variation of the measuring unit shown in FIG. 17.

Referring to FIG. 22, a description will be given of a measuring unit 80J as a variation of the measuring unit 80H. FIG. 22 is a schematic sectional view showing a structure of the measuring unit 80J as a variation of the measuring unit 80H. In FIG. 22, a solid line ML (ML1 and ML2) indicates an optical path of the measurement light ML (ML1 and ML2) before the refractive index of the liquid 70 changes, and broken lines ML1' and ML2' indicate optical paths of the measurement light ML (ML1 and ML2) after the refractive index of the liquid 70 has changed.

In the measuring unit 80J, the measurement light ML enters the beam splitter 810 via the illumination optical system (not shown), and is split into the measurement light ML1 and the measurement light ML2. The measurement light ML1 enters the prism 815, while the measurement light ML2 enters the prism 815 via a mirror 816.

The measuring unit 80J introduces a pair of measurement lights ML1 and ML2 to the liquid 70, and a pair of lights from the reflecting surface 78a of the substrate 78 to the detector 84 via the beam splitter 810. The measuring unit 80J detects the relative change between the measurement lights ML1 and ML2 caused by the change in the refractive index of the liquid 70, and measures the amount of the change in the refractive index of the liquid 70. More specifically, when the refractive index of the liquid 70 does not change, as shown in FIG. 22, two measurement lights ML1 and ML2 have the same incident position on the detector 84 (as in the solid line ML). On the other hand, when the refractive index of the liquid 70 changes, the incident positions of two measurement lights ML1' and ML2' do not accord with each other on the detector 84. In FIG. 22, the pinhole PH may be arranged between the detector 84 and the beam splitter 810. The measuring unit 80J may more precisely measure the refractive index of the liquid 70 than the measuring unit 80H, since the measuring unit 80J uses two measurement lights ML1 and ML2.

Figure 23:
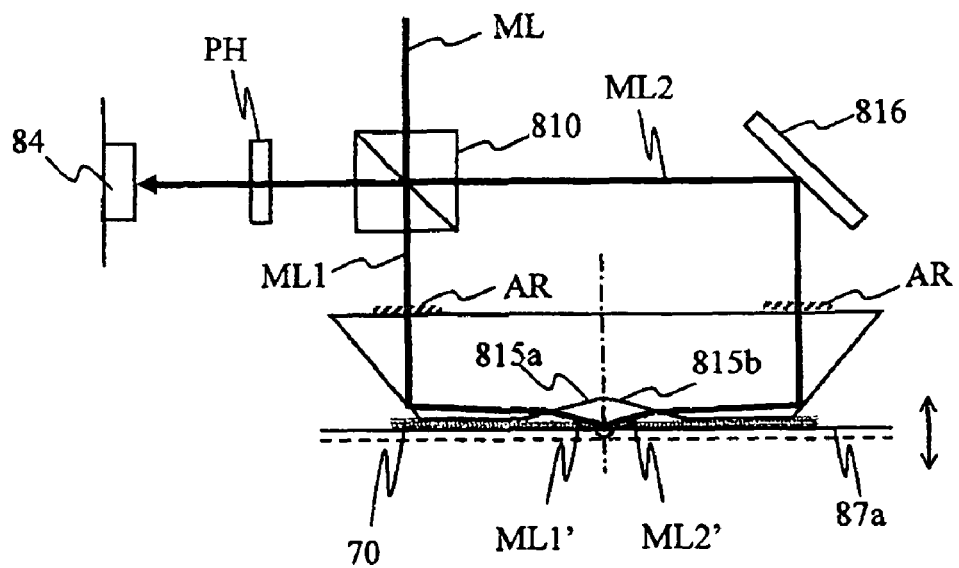
FIG. 23 is a view showing an optical path change of a measurement light when the refractive index of the liquid changes in the measuring unit shown in FIG. 22.

In addition, the amount of the change in the refractive index 70 may be measured, as shown in FIG. 23, by driving the reflecting surface 87a in the normal or longitudinal direction. Here, FIG. 23 is a view showing an optical path change of the measurement light ML when the refractive index of the liquid 70 changes.

Referring to FIG. 23, when the refractive index of the liquid 70 changes, the refractive angle in the liquid 70 changes, the relative incident positions of the measurement lights ML1 and ML2 upon the detector 84 change, and the output of the detector 84 changes. In FIG. 23, a driving mechanism of the stage 88 controls a position of the reflecting surface 87a of the substrate 87, and the reflecting surface 87a is driven so that an output of the detector 84 accords with an output before the refractive index of the liquid 70 changes. In other words, the reflecting surface 87a is driven so that the reflecting position of the measurement light ML1' accords with the reflecting position of the measurement light ML2' in the reflecting surface 87a. Thereby, the amount of the change in the refractive index of the liquid 70 can be measured from the information about the driving amount of the reflecting surface 87a of the substrate 87.

Figure 6:
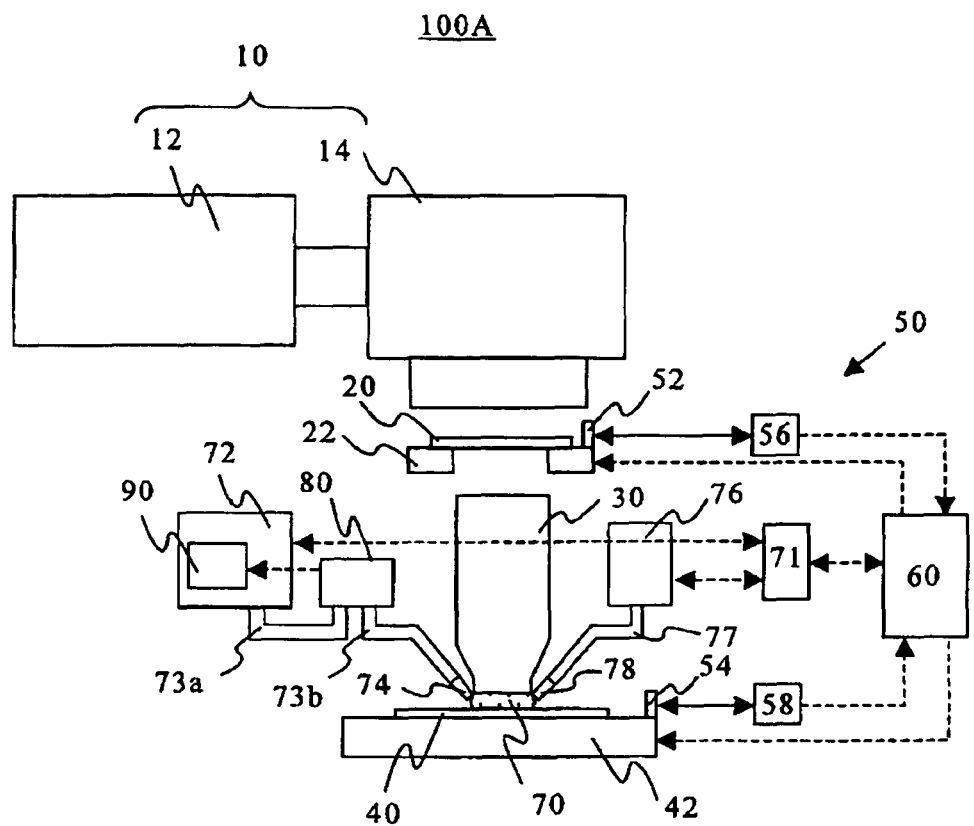
FIG. 6 is a schematic sectional view of a structure of a variation of the exposure apparatus shown in FIG. 1.

FIG. 6 shows a schematic sectional view of a structure of an exposure apparatus 100A having a temperature controller 90 that is adapted to correct the refractive index of the liquid 70. The exposure apparatus 100A is different from the exposure apparatus 100 in that the liquid supply unit 72 has the temperature controller 90 in the exposure apparatus 100A, and an output of the measuring unit 80 (80A to 80J) is electrically fed back to the temperature controller 90. Here, the temperature controller 90 may be arranged in the liquid supply unit 72. The temperature controller 90 controls the temperature of the liquid 70 so as to cancel the change in the refractive index. The temperature controller can be implemented by the known technology. For example, it may use a Peltier element to cool and to heat the wall surface of the container of the liquid 70.

Figure 7:
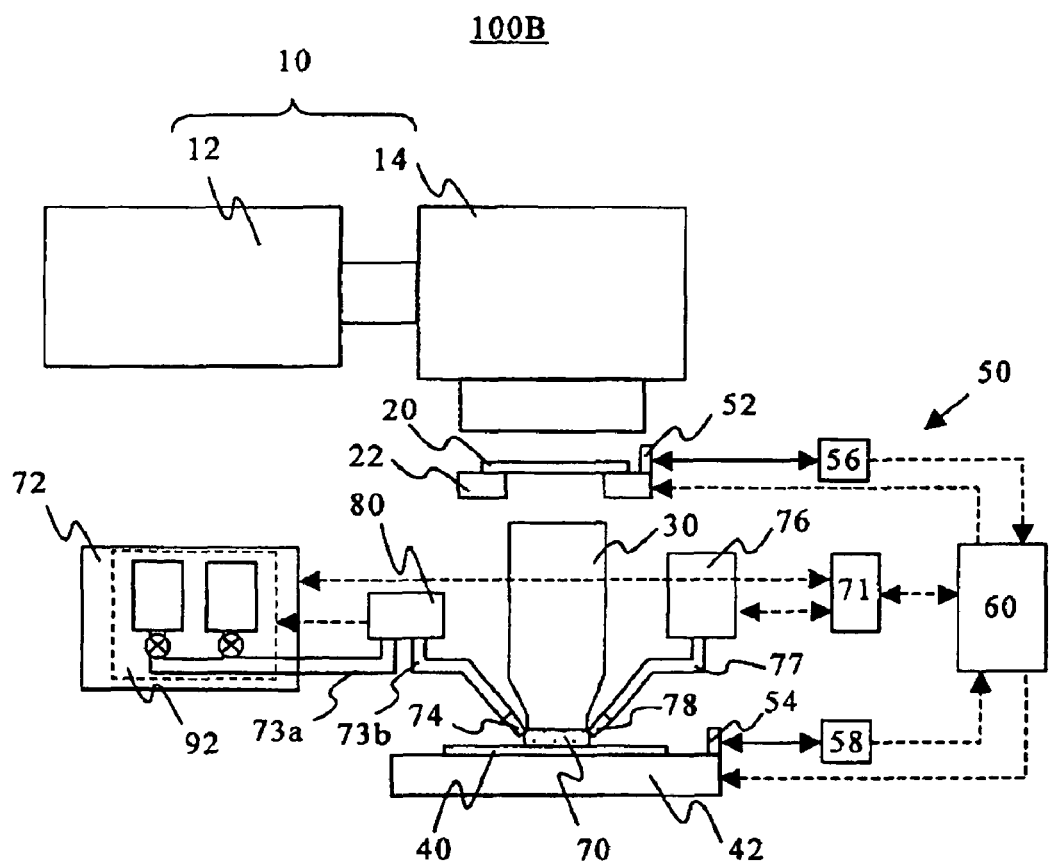
FIG. 7 is a schematic sectional view of a structure of another variation of the exposure apparatus shown in FIG. 1.

FIG. 7 is a schematic sectional view showing a structure of an exposure apparatus 100B having a concentration controller 92 that is adapted to correct the refractive index of the liquid 70. The exposure apparatus 100B is different from the exposure apparatus 100 in that the liquid supply unit 72 has the concentration controller 92 in the exposure apparatus 100B, and an output of the measuring unit 80 (80A to 80J) is electrically fed back to the concentration controller 92. Here, the concentration controller 92 is, for example, a mixer that includes plural liquid containers, pipes used to connect these plural containers with each other, and a valve that controls the flow from each container. The concentration controller 92 controls the concentration of the liquid 70 so as to cancel the change in the refractive index.

Figure 8:
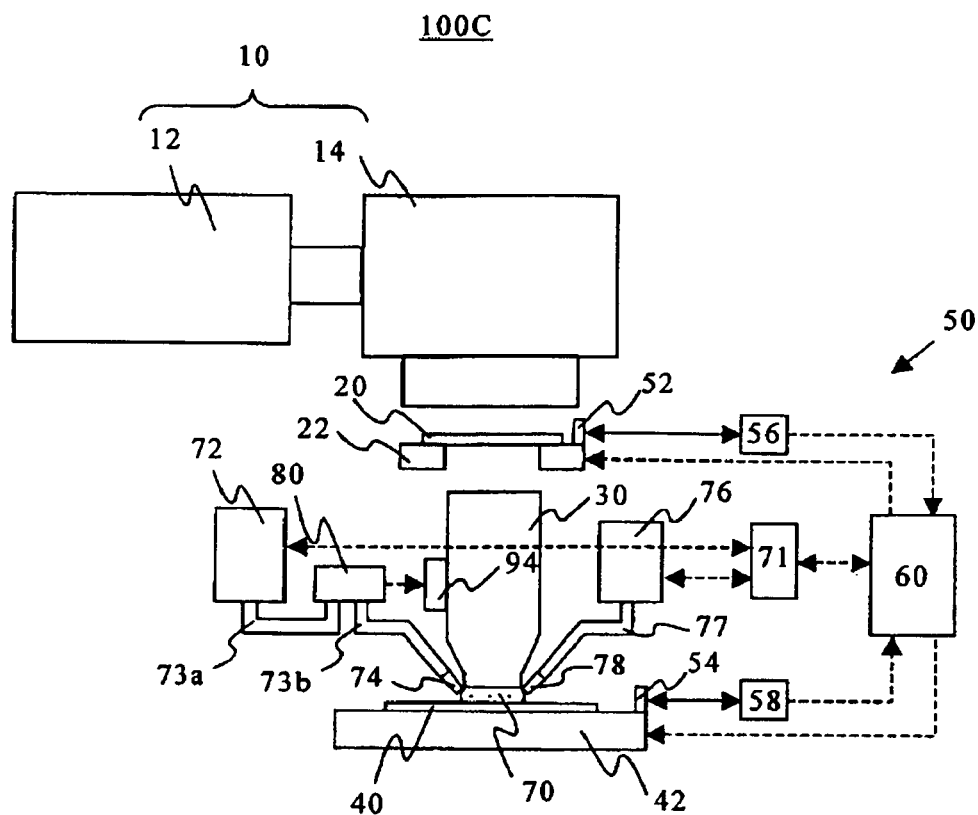
FIG. 8 is a schematic sectional view of a structure of still another variation of the exposure apparatus shown in FIG. 1.

FIG. 8 is a schematic sectional view showing a structure of an exposure apparatus 100C having an aberration controller 94 that is adapted to correct the refractive index of the liquid 70. The exposure apparatus 100C is different from the exposure apparatus 100 in that the exposure apparatus 100C has a correction mechanism for the projection optical system 30 and the aberration controller 94, which is electrically connected to the correction mechanism, and an output of the measuring unit 80 (80A to 80J) is electrically fed back to the aberration controller 94. The correction mechanism for the projection optical system 30 uses, for example, a mechanical actuator that adjusts one or more lens positions. In other words, the exposure apparatus 100C allows plural optical elements (not shown) in the projection optical system 30 to move in the optical-axis direction and/or a direction orthogonal to the optical-axis direction. The exposure apparatus 100C drives one or more optical elements based on aberrational information obtained from the measuring unit 80, and can correct or optimize one or more aberrations of the projection optical system 30, in particular, Seidel's classification of aberrations. The means for adjusting the aberration of the projection optical system 30 can use various known systems, in addition to a movable lens, such as a movable lens, a movable mirror (when the projection optical system is a catadioptric or a catoptric optical system), an inclinable plane-parallel plate, a pressure-controllable space, and a surface correction using an actuator. When the projection optical system 30 is a catadioptric optical system, a deformable mirror may be used. The lens temperature distribution may be controlled by heating one or more lenses. The aberration controller 94 adjusts the projection optical system 30 so as to cancel the change in the refractive index.

Figure 24:
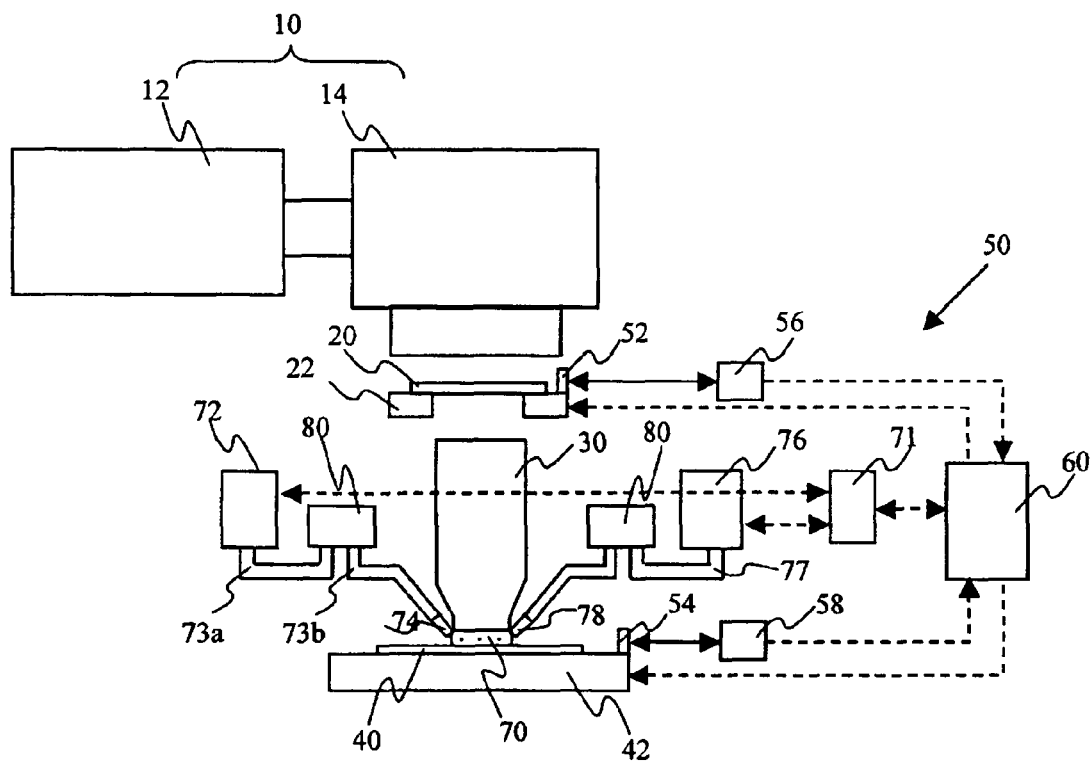
FIG. 24 is a schematic sectional view of still another structure of an exposure apparatus according to one aspect of the present invention.

FIG. 24 is a schematic sectional view showing a structure of the exposure apparatus 100D that has a measuring unit 80 (80A to 80J) at the liquid supply side and at the liquid recovery side. The exposure apparatus 100D includes the measuring unit 80 between the liquid supply unit 72 and the liquid supply port 74, and between the liquid recovery port 78 and the liquid recovery unit 76. The exposure apparatus 100D can obtain refractive index information of the pre-exposure or initial state and refractive index information of the exposure state of the liquid 70 supplied by the measuring unit 80 to the liquid supply side. In addition, the measuring unit 80 arranged at the liquid recovery side can obtain the refractive index information of the liquid 70 that changes through the exposure process. Therefore, the exposure apparatus 100D can obtain differential information between the refractive index of the supplied liquid 70 and that of the exposed liquid 70. The exposure apparatus 100D can precisely control the supply/recovery timings of the liquid 70 by feeding back the differential information to the liquid supply unit 72 and the liquid recovery unit 76. While two measuring units 80 may be arranged at the liquid supply side and at the recovery side in the exposure apparatus 100D, two or more measuring units 80 may be provided.

In exposure, the illumination optical system 14 illuminates the reticle 20 using the light emitted from the light source section 12. The light that has passed the reticle 20 and contained a reticle pattern is imaged on the plate 40 by the projection optical system 30 and the liquid 70. The measuring unit 80 (80A to 80J) measures the amount of the change in the refractive index of the liquid 70, and one of the temperature control, the concentration control, the aberration adjustment of the projection optical system 30, and the supply/recovery timings are provided to cancel out the change. Therefore, the exposure apparatus 100 can expose the pattern of the reticle 20 at a high resolution onto the plate 40, while preventing exposed pattern deterioration caused by a change in the refractive index of the liquid 70.

Figure 9:
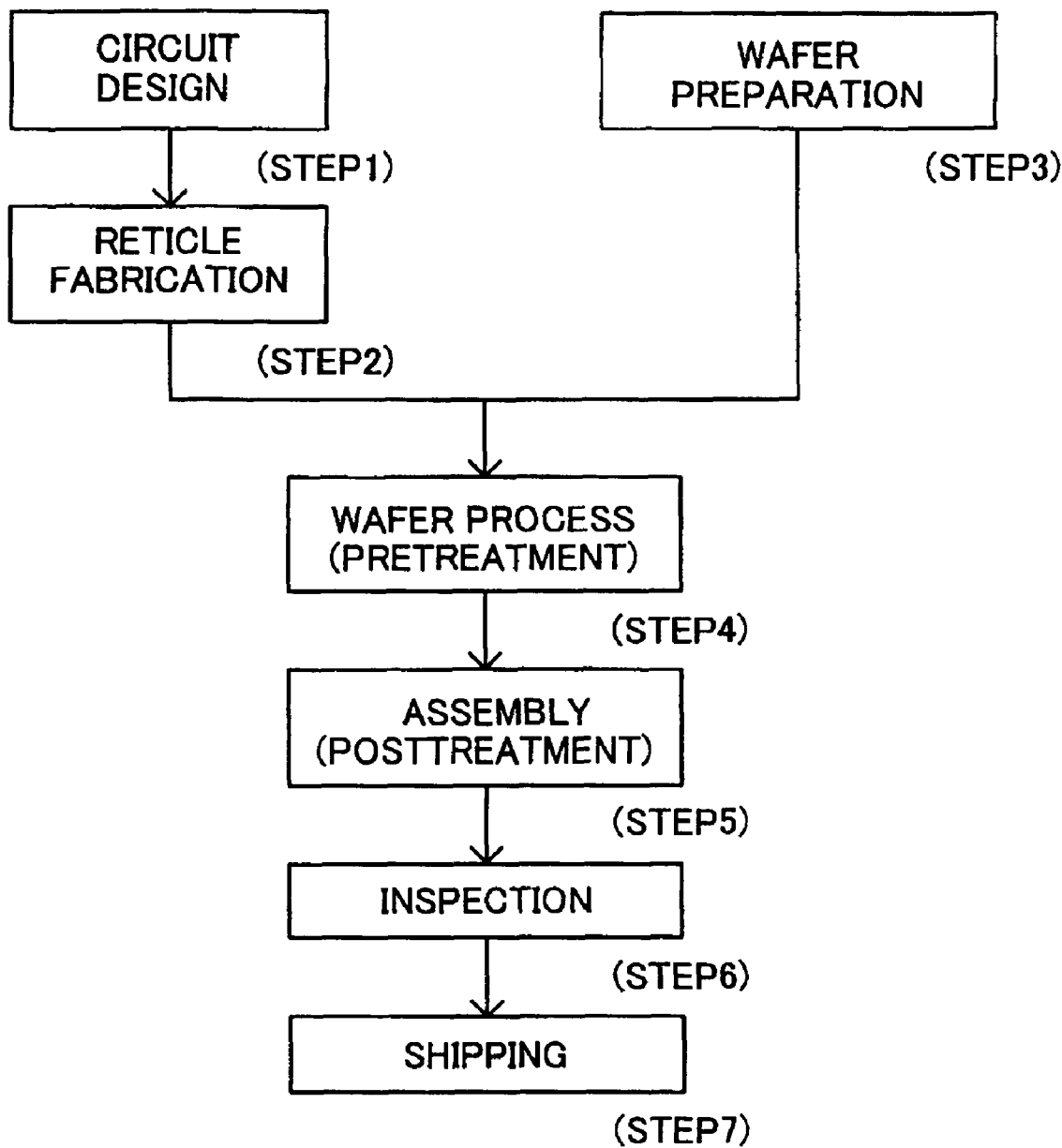
FIG. 9 is a flowchart for explaining the manufacture of devices (such as semiconductor chips, such as ICs and LCDs, CCDs, and the like).
Figure 10:
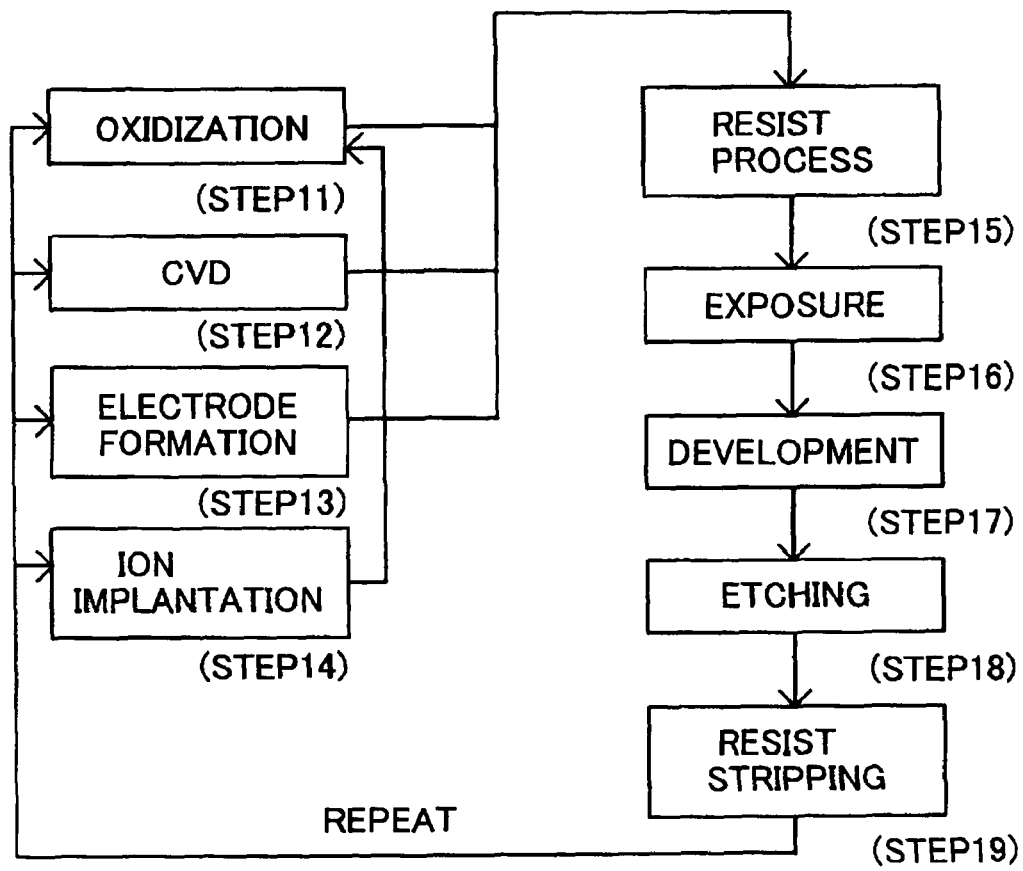
FIG. 10 is a detailed flowchart of a wafer process as Step 4 shown in FIG. 9.

Referring now to FIGS. 9 and 10, a description will be given of an embodiment of a device manufacturing method using the exposure apparatuses 100A to 100D. FIG. 9 is a flowchart for explaining how to fabricate devices (i.e., semiconductor chips, such as ICs and LSIs, LCDs, CCDs, and the like). Here, a description will be given of the fabrication of a semiconductor chip as an example. Step 1 (circuit design) designs a semiconductor device circuit. Step 2 (reticle fabrication) forms a reticle having a designed circuit pattern. Step 3 (wafer preparation) manufactures a wafer using materials such as silicon. Step 4 (wafer process), which is also referred to as a pre-treatment, forms actual circuitry on the wafer through lithography using the reticle and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 10 is a detailed flowchart of the wafer process in Step 4. Step 11 (oxidation) oxidizes the surface of the wafer. Step 12 (CVD) forms an insulating film on the surface of the wafer.

Step 13 (electrode formation) forms electrodes on the wafer by vapor disposition, and the like. Step 14 (ion implantation) implants ions into the wafer. Step 15 (resist process) applies a photosensitive material onto the wafer. Step 16 (exposure) uses the exposure apparatuses 100A to 100D to expose a circuit pattern of the reticle onto the wafer. Step 17 (development) develops the exposed wafer. Step 18 (etching) etches parts other than a developed resist image. Step 19 (resist stripping) removes unused resist after etching. These steps are repeated, and multi-layer circuit patterns are formed on the wafer. Use of the manufacturing method in this embodiment helps to manufacture higher-quality devices than ever. The device manufacturing method that uses the exposure apparatuses 100A to 100D and resultant devices constitute one aspect of the present invention.

Further, the present invention is not limited to these preferred embodiments, and various variations and modifications may be made without departing from the scope of the present invention.

What is claimed is:

1. An exposure apparatus comprising:
   (a) an illumination optical system for illuminating a reticle with exposure light;
   (b) a projection optical system for projecting a pattern of the illuminated reticle onto a plate via a liquid supplied to a space between said projection optical system and the plate;
   (c) a supply pipe;
   (d) a supply unit configured to supply the liquid to the space via the supply pipe;
   (e) a recovery pipe;
   (f) a recovery unit configured to recover the liquid from the space via the recovery pipe; and
   (g) a measuring unit configured to measure a refractive index of the liquid,
   wherein said measuring unit includes:
       (i) a light source for generating measurement light having the same wavelength, repetition rate and energy output as those of the exposure light;
       (ii) a liquid reservoir for storing the liquid, the liquid reservoir being disposed apart from the space via the supply pipe or the recovery pipe, and having a transmitting surface for transmitting the measurement light and a reflecting surface for reflecting the measurement light transmitted by the transmitting surface and the liquid in the reservoir; and
       (iii) a detector for detecting the measurement light reflected on the reflecting surface and transmitted by the liquid in said liquid reservoir and the transmitting surface.

2. An exposure apparatus according to claim 1, further comprising a beam splitter configured to split the exposure light so that one of the split exposure light beams enters the liquid reservoir as the measurement light.

3. An exposure apparatus according to claim 1, wherein an angle between a normal to the transmitting surface and a normal to the reflecting surface is 0°.

4. An exposure apparatus according to claim 1, wherein the transmitting surface includes a first transmitting surface for transmitting the measurement light to the reflecting surface, and a second transmitting surface for transmitting the measurement light reflected on the reflecting surface and transmitted by the liquid in the liquid reservoir, and wherein an angle between a normal to each of the first and second transmitting surfaces and a normal to the reflecting surface is greater than 0°.

5. An exposure apparatus according to claim 4, wherein the normal to the first transmitting surface and the normal to the second transmitting surface intersect with each other at a position closer to the reflecting surface than the transmitting surface.

6. An exposure apparatus according to claim 4, wherein $n1<n2$ is met, wherein n1 is a refractive index of the liquid reservoir, and n2 is a refractive index of the liquid.

7. An exposure apparatus according to claim 4, wherein $\theta IN = \theta 2 + \theta p$ is met, wherein $\theta p$ is an angle between a normal to the transmitting surface and a normal to the reflecting surface, $\theta 2$ is an angle between the normal to the transmitting surface and an optical axis of the measurement light in the liquid, and $\theta IN$ is an angle between the normal to the reflecting surface and the optical axis of the measurement light.

8. An exposure apparatus according to claim 1, wherein the liquid that circulates through the liquid reservoir is in synchronization with the liquid that circulates through the space.

9. An exposure apparatus according to claim 1, further comprising:
   a controller configured to control, based on a measurement result by said measuring unit, both a liquid supply timing by said supply unit and a liquid recovery timing by said recovery unit.

10. A method of manufacturing a device, the method comprising:
    exposing a plate using an exposure apparatus;
    developing the exposed plate; and
    processing the developed plate to manufacture the device,
    wherein the exposure apparatus comprises:
    (a) an illumination optical system for illuminating a reticle with exposure light;
    (b) a projection optical system for projecting a pattern of the reticle onto a plate via a liquid supplied to a space between the projection optical system and the plate;
    (c) a supply pipe;
    (d) a supply unit configured to supply the liquid to the space via the supply pipe;
    (e) a recovery pipe;
    (f) a recovery unit configured to recover the liquid from the space via the recovery pipe; and
    (g) a measuring unit for measuring a refractive index of the liquid,
    wherein the measuring unit includes:
        (i) a light source for generating measurement light having the same wavelength, repetition rate and energy output as those of the exposure light;
        (ii) a liquid reservoir for storing the liquid, the liquid reservoir being disposed apart from the space via the supply pipe or the recovery pipe and having a transmitting surface for transmitting the measurement light and a reflecting surface for reflecting the measurement light transmitted by the transmitting surface and the liquid in the liquid reservoir; and
        (iii) a detector for detecting the measurement light reflected on the reflecting surface and transmitted by the liquid in the liquid reservoir and the transmitting surface.

* * * * *